(12) United States Patent
Pullen et al.

(10) Patent No.: US 10,756,614 B2
(45) Date of Patent: Aug. 25, 2020

(54) LOSSLESS AVERAGE INPUT AND OUTPUT CURRENT SENSING IN A SWITCHED-MODE POWER SUPPLY

(71) Applicant: QUALCOMM Incorporated, San Diego, CA (US)

(72) Inventors: Stuart Pullen, Raleigh, NC (US); Michael Bui, San Diego, CA (US); Steve Hawley, Emerald Hills, CA (US); Chunping Song, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 16/004,536

(22) Filed: Jun. 11, 2018

(65) Prior Publication Data

US 2019/0379270 A1   Dec. 12, 2019

(51) Int. Cl.
| | |
|---|---|
| *H02M 1/00* | (2006.01) |
| *H02M 3/158* | (2006.01) |
| *G01R 31/40* | (2020.01) |
| *G01R 19/00* | (2006.01) |
| *G11C 27/02* | (2006.01) |

(52) U.S. Cl.
CPC ............ *H02M 1/00* (2013.01); *G01R 19/003* (2013.01); *G01R 31/40* (2013.01); *G11C 27/026* (2013.01); *H02M 3/158* (2013.01); *H02M 2001/0009* (2013.01)

(58) Field of Classification Search
CPC ........ H02M 1/00; H02M 3/335; H02M 3/158; H02M 2001/0038; G01R 19/003; G01R 31/40; G11C 27/026

USPC .......................................... 323/271–289, 315
See application file for complete search history.

(56) References Cited

U.S. PATENT DOCUMENTS

| | | | |
|---|---|---|---|
| 6,219,262 B1 * | 4/2001 | Burgyan ............ | H02M 3/33507 363/21.04 |
| 6,583,610 B2 * | 6/2003 | Groom .................. | H02M 3/156 323/224 |
| 7,107,468 B2 * | 9/2006 | Pullen ................. | H02M 3/1584 323/259 |

(Continued)

FOREIGN PATENT DOCUMENTS

WO         2017137996 A1      8/2017

*Primary Examiner* — Thienvu V Tran
*Assistant Examiner* — Nusrat Quddus
(74) *Attorney, Agent, or Firm* — Patterson + Sheridan, L.L.P./Qualcomm Incorporated

(57) ABSTRACT

Methods and apparatus for current sensing and error correction in a switched-mode power supply composed of a high-side transistor coupled to a low-side transistor are described. One example method generally includes capturing a current associated with the low-side transistor at a first time corresponding to the low-side transistor turning off; capturing a current associated with the high-side transistor at a second time corresponding to a first delay after the high-side transistor turns on; capturing the current associated with the high-side transistor at a third time corresponding to the high-side transistor turning off; and applying a first correction current to a current-summing node of the current-sensing circuit for a first interval based on the first delay, wherein the first correction current is based on the captured current associated with the low-side transistor at the first time and on the captured current associated with the high-side transistor at the second time.

20 Claims, 11 Drawing Sheets

(56) References Cited

U.S. PATENT DOCUMENTS

| | | | |
|---|---|---|---|
| 8,274,268 B2* | 9/2012 | Yen | H02M 3/156 |
| | | | 323/282 |
| 8,436,596 B2* | 5/2013 | Taylor | H05B 33/0815 |
| | | | 323/274 |
| 8,497,734 B2* | 7/2013 | Stanley | H03F 1/0277 |
| | | | 330/10 |
| 9,588,157 B2* | 3/2017 | Alcouffe | G01R 19/257 |
| 9,755,514 B2* | 9/2017 | Pullen | H02M 3/158 |
| 9,887,625 B2 | 2/2018 | Ozawa | |
| 10,270,342 B2 | 4/2019 | Pullen et al. | |
| 2005/0007087 A1 | 1/2005 | Pullen et al. | |
| 2007/0008753 A1* | 1/2007 | Kroes | H02M 1/32 |
| | | | 363/56.01 |
| 2007/0008756 A1* | 1/2007 | Djenguerian | H02M 1/32 |
| | | | 363/95 |
| 2010/0008106 A1* | 1/2010 | Kawabe | H02M 3/33507 |
| | | | 363/21.01 |
| 2012/0229107 A1 | 9/2012 | Chen et al. | |
| 2013/0057245 A1* | 3/2013 | Hirotsu | H02M 7/53803 |
| | | | 323/312 |
| 2017/0324331 A1 | 11/2017 | Zhang et al. | |
| 2018/0048235 A1 | 2/2018 | Karlsson et al. | |
| 2019/0052174 A1* | 2/2019 | Gong | G05F 1/575 |

* cited by examiner

LOSSLESS AVERAGE INPUT AND OUTPUT CURRENT SENSING IN A SWITCHED-MODE POWER SUPPLY

TECHNICAL FIELD

Certain aspects of the present disclosure generally relate to power electronic circuits and, more particularly, to switching regulators and current-sensing circuitry therefor.

BACKGROUND

A voltage regulator ideally provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A switching regulator may be implemented by a switched-mode power supply (SMPS), such as a buck converter.

A buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., a shunt capacitive element). The high-side and low-side switches are typically implemented with transistors, although the low-side switch may alternatively be implemented with a diode.

Power management integrated circuits (power management ICs or PMICs) are used for managing the power requirement of a host system and may include and/or control one or more voltage regulators (e.g., buck converters). A PMIC may be used in battery-operated devices, such as mobile phones, tablets, laptops, wearables, etc., to control the flow and direction of electrical power in the devices. The PMIC may perform a variety of functions for the device such as DC-to-DC conversion, battery charging, power-source selection, voltage scaling, power sequencing, etc.

SUMMARY

Aspects of the present disclosure generally relate to methods and apparatus for accurately sensing average input and/or output current in switched-mode power supplies (e.g., buck converters, boost converters, or buck-boost converters).

Certain aspects of the present disclosure provide a current-sensing circuit for a switched-mode power supply composed of a high-side transistor and a low-side transistor coupled to the high-side transistor. The current-sensing circuit generally includes a high-side current-sensing amplifier having an input for coupling to the high-side transistor; a low-side current-sensing amplifier having an input for coupling to the low-side transistor; a first sample-and-hold circuit coupled to an output of the low-side current-sensing amplifier and configured to capture a current associated with the low-side transistor at a first time corresponding to the low-side transistor turning off; a second sample-and-hold circuit coupled to an output of the high-side current-sensing amplifier and configured to capture a current associated with the high-side transistor at a second time corresponding to a first delay after the high-side transistor turns on; a third sample-and-hold circuit coupled to the output of the high-side current-sensing amplifier and configured to capture the current associated with the high-side transistor at a third time corresponding to the high-side transistor turning off; a first voltage-to-current converter having an input coupled to an output of the first sample-and-hold circuit and to an output of the second sample-and-hold circuit; a first switch coupled between an output of the high-side current-sensing amplifier and a sensing node for the current-sensing circuit; and a second switch coupled between an output of the first voltage-to-current converter and the sensing node.

Certain aspects of the present disclosure provide a method of current sensing and correction in a switched-mode power supply composed of a high-side transistor and a low-side transistor coupled to the high-side transistor. The method generally includes capturing, with a current-sensing circuit, a current associated with the low-side transistor at a first time corresponding to the low-side transistor turning off; capturing a current associated with the high-side transistor at a second time corresponding to a first delay after the high-side transistor turns on; capturing the current associated with the high-side transistor at a third time corresponding to the high-side transistor turning off; and applying a first correction current to a current-summing node of the current-sensing circuit for a first interval based on the first delay, wherein the first correction current is based on the captured current associated with the low-side transistor at the first time and on the captured current associated with the high-side transistor at the second time.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

Like reference numbers and designations in the various drawings indicate like elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Current Sensing and Error Correction

In order to charge the battery in a portable device (e.g., a smartphone, tablet, and the like), a battery charging circuit may be utilized. For certain aspects, the battery charging circuit may reside in a power management integrated circuit (PMIC) in the device. The battery charging circuit may comprise two or more parallel charging circuits, each capable of charging the battery, which may be connected together and to the battery in an effort to provide fast charging of the battery. The parallel charging circuits can be configured so that these circuits do not adversely interfere with each other during battery charging (e.g., in a master-slave relationship). Example master-slave battery charging circuits are described in U.S. Pat. No. 9,590,436 to Sporck et al., filed Apr. 11, 2014 and entitled "Master-Slave Multi-Phase Charging," herein incorporated by reference in its entirety.

Figure 1:
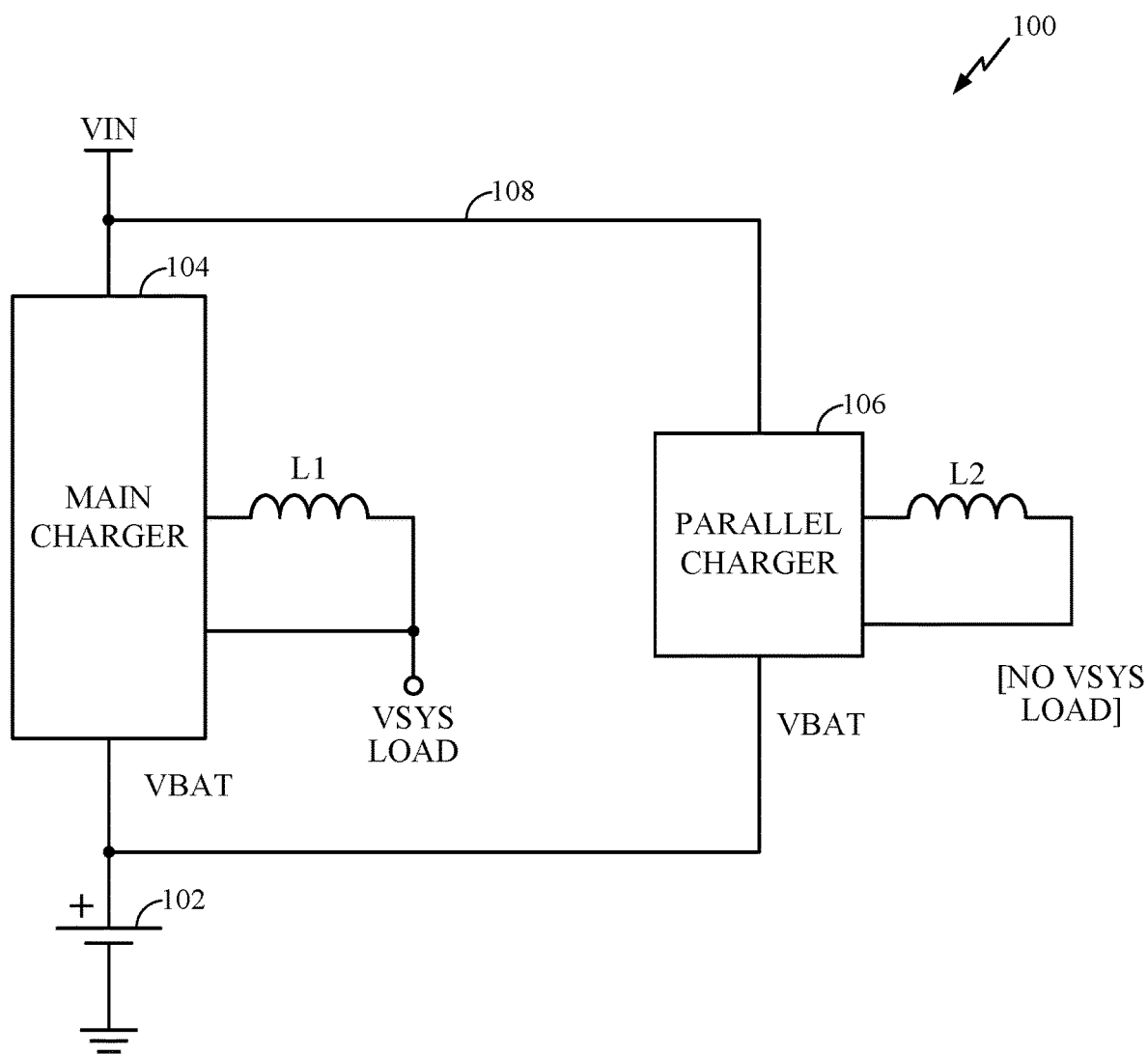
FIG. 1 is a block diagram of an example master-slave charging circuit for charging a battery, where the master-slave charging circuit includes two parallel charging circuits.

FIG. 1 is a block diagram of an example master-slave charging circuit 100 for charging a battery 102. The master-slave charging circuit 100 includes two parallel charging circuits: a main charger 104 (also referred to as a master charger) and a parallel charger 106 (also referred to as a slave charger). The main charger 104 and the parallel charger 106 may receive power from the same power supply voltage rail 108 (e.g., with input voltage VIN as illustrated in FIG. 1) or from different power sources (e.g., different power supply rails). The main charger 104 and the parallel charger 106 may use the same or different power supply circuit topologies. For example, the main charger 104 may employ a switched-mode power supply (SMPS) topology (e.g., a buck converter topology), while the parallel charger 106 is implemented with a charge pump topology or the same SMPS topology. With buck converters, the main charger 104 and the parallel charger 106 may include or be connected to an inductor L1 and an inductor L2, respectively, in an effort to maintain continuous current out of the chargers and into respective loads. The main charger 104 may control the parallel charger 106, but both chargers in the master-slave charging circuit 100 are utilized to charge the battery 102 from respective battery voltage nodes (VBAT). As illustrated in FIG. 1, while the main charger 104 may also be used to provide power to other loads within the device (referred to as the system load voltage, or VSYS LOAD), the parallel charger 106 may be used solely to charge the battery 102.

Figure 2B:
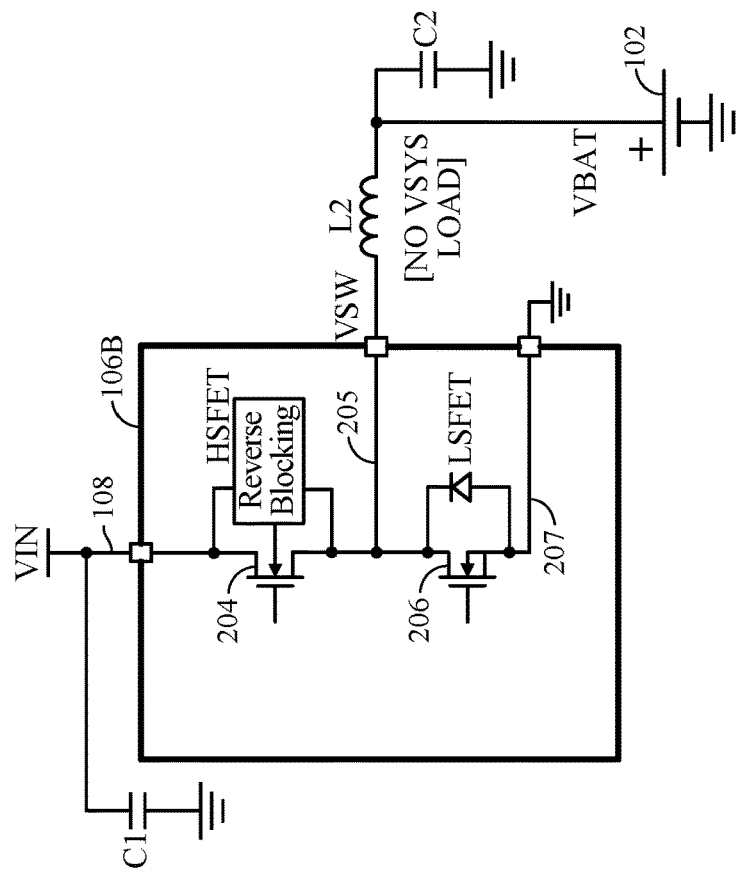
FIG. 2B is a schematic diagram of an example slave battery charging circuit using a buck converter topology without an FPFET for sensing average input current or a BATFET for sensing average output current, in accordance with certain aspects of the present disclosure.
Figure 2A:
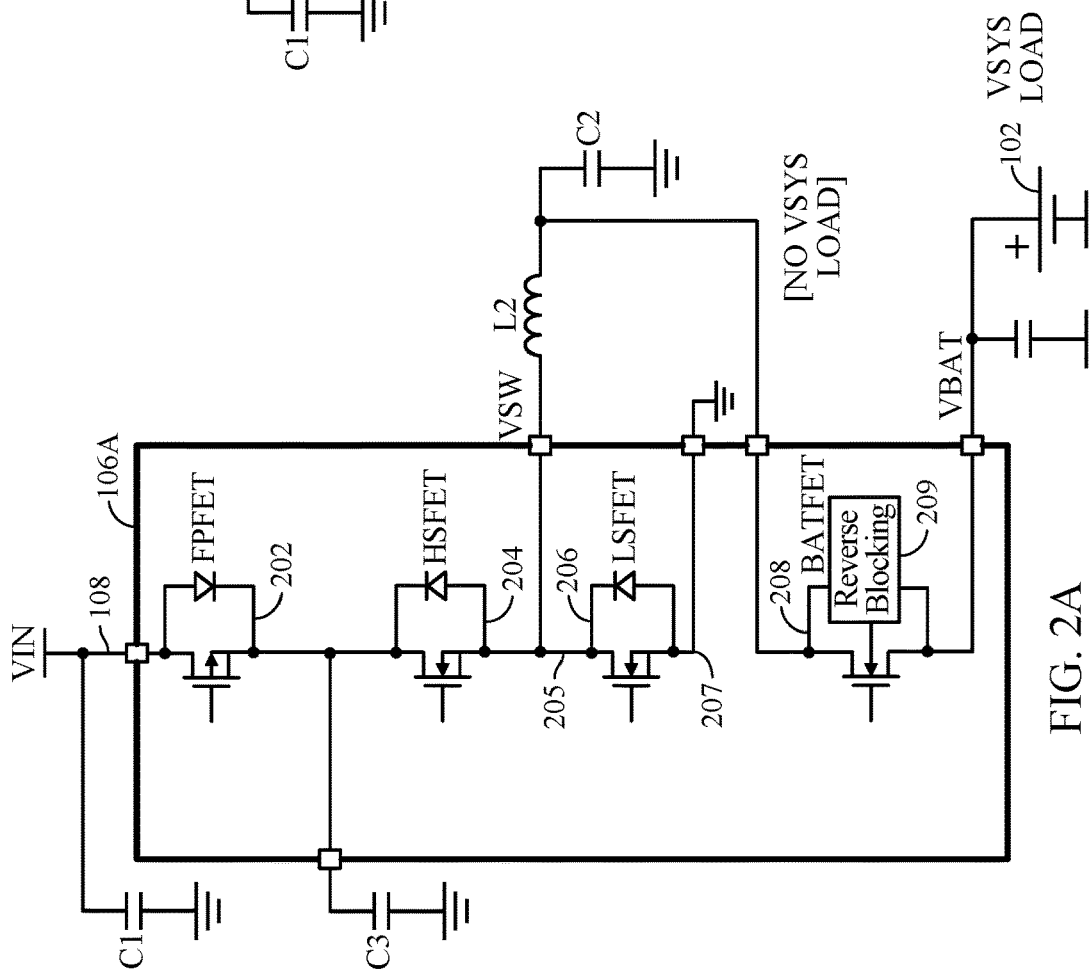
FIG. 2A is a schematic diagram of an example slave battery charging circuit using a buck converter topology, the circuit including a front porch field-effect transistor (FPFET) for sensing average input current and a battery field-effect transistor (BATFET) for sensing average output current, in accordance with the prior art.

Battery chargers may desire an accurate measurement of average input current to work with different adapters without collapsing the input voltage. One approach to sensing average input current includes adding a front porch field-effect transistor (FPFET) to sense the current between the adapter (e.g., supplying a USBIN voltage) and the switched-mode power supply (e.g., a buck converter). FIG. 2A is a schematic diagram of an example parallel charger 106A using a buck converter with a FPFET 202 for measuring average input current. The buck converter comprises a high-side field-effect transistor (HSFET) 204, a low-side field-effect transistor (LSFET) 206, and the inductor L2. In the buck converter, the drain of the HSFET 204 is coupled to the source of the FPFET 202, and the source of the HSFET 204 is coupled to the drain of the LSFET 206 and to a first terminal of the inductor L2 via the switching node 205 (labeled "VSW" for switching node voltage). The source of the LSFET 206 is coupled to the reference potential node 207, which may be grounded to a reference potential (e.g., electrical ground) for the parallel charger 106A. Although not shown, a person having ordinary skill in the art of switched-mode power supplies will understand that the gates of the HSFET 204 and the LSFET 206 will be connected to gate drivers, which modulate the duty cycle of the gate signals controlling the FETs based on a feedback signal from the output of the buck converter. The gate signals may be modulated using pulse-width modulation, for example.

Including the FPFET 202 in the parallel charger 106A, however, consumes valuable die area, uses additional die pins, and hurts efficiency. For example, sensing the input current associated with the HSFET 204 of the buck converter is susceptible to switching noise and slew rate errors due to the finite bandwidths of a current-sensing amplifier (described in greater detail below). Furthermore, because the FPFET 202 is in the input current path of the parallel charger 106A with a finite on-resistance, the FPFET also has a power loss associated therewith.

Battery chargers may also desire an accurate measurement of average output current to safely and accurately charge the battery. One approach to sensing average output current entails using a battery field-effect transistor (BATFET) and associated sensing circuitry to sense the charging current flowing from the output of the switched-mode power supply (e.g., the buck converter) into the battery. FIG. 2A illustrates a BATFET 208 having a drain coupled to a second terminal of the inductor L2 and a source coupled to the VBAT node of the parallel charger 106A, for connecting to the battery 102. The BATFET 208 also provides isolation. In the event of a VIN short circuit, the reverse blocking circuitry 209 of the BATFET 208 can open circuit the BATFET, thereby isolating the battery 102 from the input to protect the battery. For higher efficiency, the drain-to-source on-resistance ($R_{DSon}$) of the BATFET 208 is typically less than 10 mΩ and involves multiple pins for the drain and source connections. Because of this, the BATFET 208 typically consumes significant die area, similar to the FPFET 202.

Moreover, buck switch current is discontinuous, and the on times may change with duty cycle and/or switching frequency. Short variable on times make it difficult to design circuits that can use the HSFET or the LSFET to measure the input and output current of a buck converter accurately. The errors in measuring input and output current may include timing errors, parasitics, and bandwidth limitations. For example, the level shifters and dead times involved in high voltage operation have delays that can change with process and temperature, and protecting lower voltage devices from high voltages may involve blanking. Parasitic inductances and/or capacitances may cause the voltage of the switch node and/or the power supply rails to ring even after the transistors are fully enhanced. Furthermore, sensing circuits have finite slew rate and may not be capable of tracking the discontinuous currents seen in the FETs without significant errors. These errors may change with the on time and the current, so such errors are difficult to correct.

Certain aspects of the present disclosure are directed to techniques and apparatus for sensing average input current and/or average output current in power supply circuits using a switched-mode power supply (SMPS) topology with accurate and lossless sensing. These techniques may be used in conjunction with any suitable SMPS (e.g., a buck converter, a boost converter, or a buck-boost converter) where accurate average input and output current sensing is desired, including, but not limited to, battery charging circuits. Although aspects of the present disclosure may be combined with any suitable SMPS, the remainder of the disclosure will describe and refer to a buck converter topology for ease of explanation. The reader will understand that these techniques may also be used with other SMPS topologies. With these techniques, the FPFET and the BATFET may be removed from the power supply circuit, thereby saving die area and reducing losses, thereby increasing efficiency of the power supply circuit.

For example, in the case of a master-slave charging circuit (e.g., circuit 100), the FPFET and the BATFET may be removed from the slave charger, since the slave charger has no VSYS load and, thus, the output current from the power supply circuit is used solely to charge the battery. FIG. 2B is a schematic diagram of an example parallel charger 106B using a buck converter topology without an FPFET for sensing average input current or a BATFET for sensing average output current, in accordance with certain aspects of the present disclosure. In the parallel charger 106B, the drain of the HSFET 204 may be connected to the power supply voltage rail 108, rather than to the source of the FPFET. Also, without the FPFET and the BATFET, several pins may be removed from the parallel charger, thereby reducing the size of the integrated circuit (IC) package containing the parallel charger 106B and saving valuable real estate in a device (e.g., a portable device) comprising the master-slave charging circuit.

Figure 3:
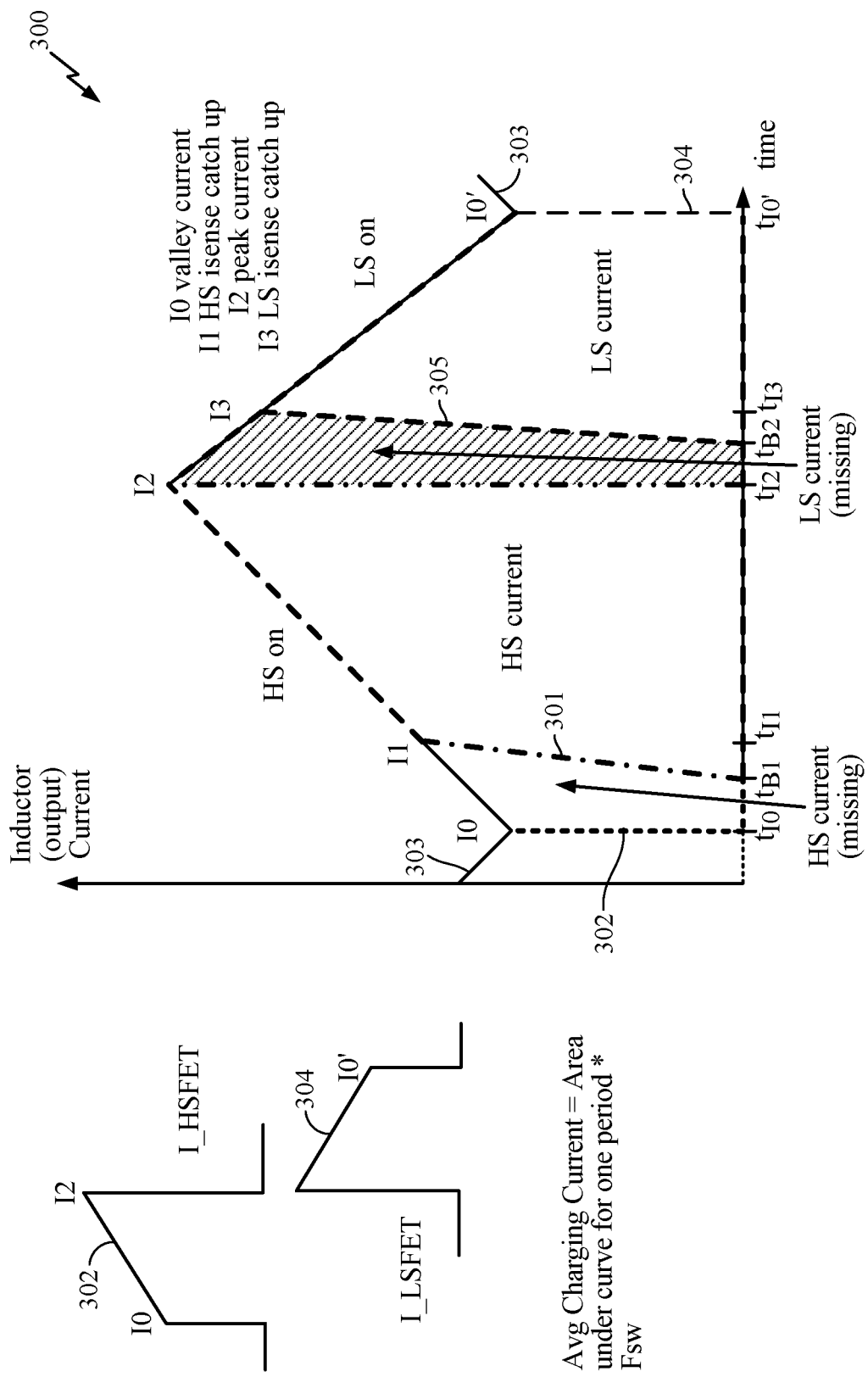
FIG. 3 is an example graph depicting waveforms of practical average current sensing and ideal average current sensing versus time.

FIG. 3 is a time-based graph 300 depicting waveforms of practical average current sensing and ideal average current sensing, illustrating flaws in the practical sensing. The graph 300 illustrates waveforms 301, 302, 303, 304, and 305. Each waveform represents current (e.g., in amperes) plotted on the y-axis as a function of time (e.g., in nanoseconds, or ns) along the x-axis. Waveform 302 represents the current (I_HSFET) in the HSFET (e.g., HSFET 204) of a buck converter through one switching period (one on/off cycle), and would ideally be the current sensed through the HSFET. Waveform 303 represents the current (IL) through the inductor (e.g., inductor L2) of the buck converter over the same period. Waveform 304 represents the current (I_LSFET) in the LSFET (e.g., LSFET 206) of a buck converter through one switching period (one on/off cycle), and would ideally be the current sensed through the LSFET.

While the HSFET is off and the LSFET is on, the inductor current IL is falling, as illustrated by waveform 303. While the HSFET is on and the LSFET is off, the inductor current IL is rising. I0 in waveform 303 represents the valley inductor current, while I2 represents the peak inductor current. The area under the waveform 303 during this rising edge (or under the waveform 302) is the charge delivered from the input source (e.g., VIN) to the load capacitor (e.g., C2) of the buck converter. The area under the waveform 303 during the rising edge divided by the switching period (Ts) represents the average input current for that switching period. When multiple average input currents per cycle are averaged, the results can be used as the average input current. The area under the waveform 303 during both the rising edge and the falling edge divided by the switching period (Ts) represents the average output current for that switching period. Multiple average output currents per cycle may be averaged to calculate an average output current value for the buck converter. However, practical current sensing as typically implemented has several error contributions that lead to inaccurate average input and average output current values. Moreover, these current sensing errors may exceed ±30% with variations in VIN and/or duty cycle, making it difficult to compensate for such errors with a factory calibration at a practically limited number of VIN and duty cycle values.

Waveform 301 represents an example measured current (I_HS_SNS) sensed through the HSFET (e.g., by a high-side current-sensing amplifier) and the errors that may be present in conventional current sensing through the HSFET (and in some cases, through a replica HSFET, as described below). For example, there may be a blanking time, after the HSFET is activated at $t_{t0}$, to wait before the high-side current-sensing amplifier is turned on at $t_{B1}$ to sense the current through the HSFET. After being turned on at $t_{B1}$ at expiration of the blanking time, the high-side current-sensing amplifier may experience a slew-rate-limited time before catching up to sensing I_HSFET at $t_{I1}$, where I1 represents the inductor current at this time $t_{I1}$ after catching up. After the slew-rate-limited time, the high-side current-sensing amplifier may still have a gain and/or offset error (not shown), leading to inaccurate high-side current sensing. Furthermore, there may be a sampling time error (not shown) associated with the high-side current-sensing amplifier turning off before the HSFET turns off at $t_{I2}$. Each of these errors may lead to differences between waveform 301 and waveform 302.

Similarly, waveform 305 represents an example measured current (I_LS_SNS) sensed through the LSFET (e.g., by a low-side current-sensing amplifier) and the errors that may be present in conventional current sensing through the LSFET (and in some cases, through a replica LSFET, as described below). For example, there may be a blanking time after the LSFET is activated at $t_{I2}$, to wait before the low-side current-sensing amplifier is turned on at $t_{B2}$ to sense the current through the LSFET. After being turned on at $t_{B2}$ at expiration of the blanking time, the low-side current-sensing amplifier may experience a slew-rate-limited time before catching up to sensing I_LSFET at $t_{I3}$, where I3 represents the inductor current at this time $t_{I3}$ after catching up. After the slew-rate-limited time, the low-side current-sensing amplifier may still have a gain and/or offset error (not shown), leading to inaccurate low-side current sensing. Furthermore, there may be a sampling time error (not shown) associated with the low-side current-sensing amplifier turning off at $t_{I0'}$ before the LSFET turns off. Each of these errors may lead to differences between waveform 305 and waveform 304.

Figure 4:
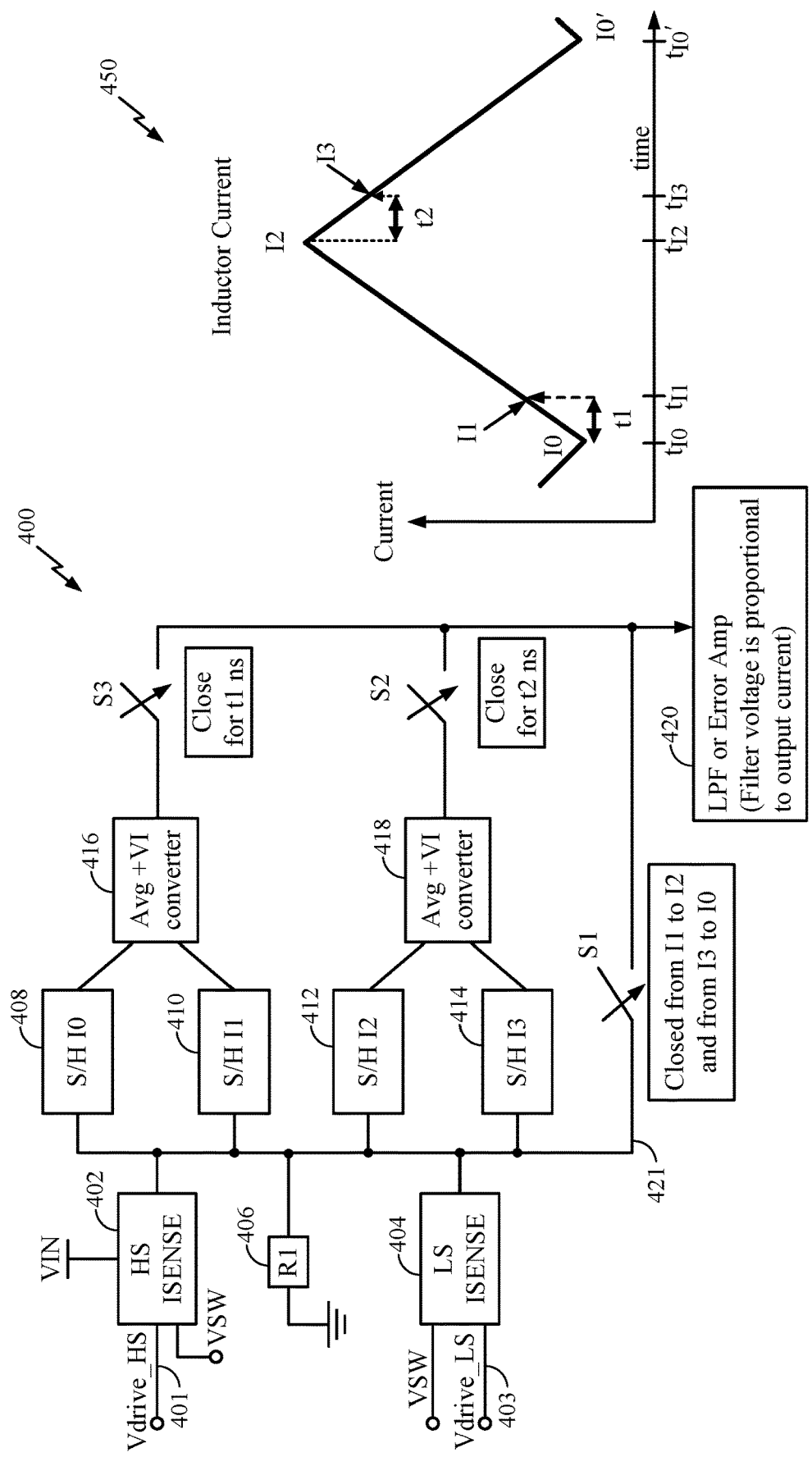
FIG. 4 is a block diagram of an example current-sensing circuit with error-correction components for coupling to a buck converter and an associated time-based graph, in accordance with certain aspects of the present disclosure.

FIG. 4 is a block diagram of an example current-sensing circuit 400 with error-correction components for coupling to a buck converter and an associated time-based graph 450, in accordance with certain aspects of the present disclosure. The current-sensing circuit 400 includes a high-side current-sensing amplifier (HS Isense) 402, a low-side current-sensing amplifier (LS Isense) 404, a resistive element 406, sample-and-hold circuits 408, 410, 412, and 414, averaging and voltage-to-current converting circuits 416 and 418, switches S1, S2, and S3, and a low-pass filter or error amplifier 420. One input of the HS Isense 402 may be coupled to a node 401 having a gate drive voltage (labeled "Vdrive_HS") for the HSFET of the buck converter. The other inputs to the HS Isense 402 may include the input source voltage (VIN) and the switching node voltage (VSW). One input of the LS Isense 404 may be coupled to a node 403 having a gate drive voltage (labeled "Vdrive_LS") for the LSFET. The other inputs to the LS Isense 404 may include VSW and a reference potential node (e.g., electrical ground) for the circuit 400. The outputs of the HS Isense 402 and the LS Isense 404 may be coupled together and to a first terminal of the resistive element 406, which has a resistance R1. The second terminal of the resistive element 406 may be coupled to the reference potential node (e.g., electrical ground) for the circuit 400. The outputs of the HS Isense 402 and the LS Isense 404 may also be coupled to the inputs of the sample-and-hold circuits 408, 410, 412, and 414 and to a first terminal of switch S1.

The outputs of the sample-and-hold circuits 408 and 410 may be coupled to the inputs of the averaging and voltage-to-current converting circuit 416, while the outputs of the sample-and-hold circuits 412 and 414 may be coupled to the inputs of the averaging and voltage-to-current converting circuit 418. The output of the averaging and voltage-to-current converting circuit 416 may be coupled to a first terminal of switch S3, and the output of the averaging and voltage-to-current converting circuit 418 may be coupled to a first terminal of switch S2. The second terminal of switch S3, the second terminal of switch S2, and the second terminal of switch S1 may be coupled to the input of the low-pass filter or error amplifier 420. The output of the low-pass filter or error amplifier 420 may be the output of the circuit 400, where the output voltage is proportional to the output current. Although not shown, the output of the circuit 400 may connect to control logic for the buck converter (e.g., for controlling duty cycles of the HSFET 204 and LSFET 206 to adjust output current of the buck converter). For certain aspects, additional circuitry may be added to control the output voltage of the buck converter.

The current-sensing amplifiers (e.g., HS Isense 402 and LS Isense 404) in the present disclosure may be implemented with current-controlled current sources, which may convert current in the transistor being sensed to a much smaller current. Persons having ordinary skill in the art will be familiar with this technique. The HS Isense 402 may be coupled to the HSFET 204 in such a way that the HS Isense can generate an output current that is proportional to the current through the HSFET while the HSFET is turned on. For example, the HS Isense 402 may be coupled to the input voltage node (labeled "VIN"), to the gate of HSFET 204 to receive the same gate drive voltage (e.g., $V_{drive\_HS}$), and to the switch node 205 (labeled "VSW"). Similarly, the LS Isense 404 may be coupled to the LSFET 206 in such a way that the LS Isense can generate an output current that is proportional to the current through the LSFET while the LSFET is turned on. For example, the LS Isense 404 may be coupled to the gate of the LSFET 206 to receive the same gate drive voltage (e.g., $V_{drive\_LS}$) and to the switch node 205 (labeled "VSW").

Figure 5:
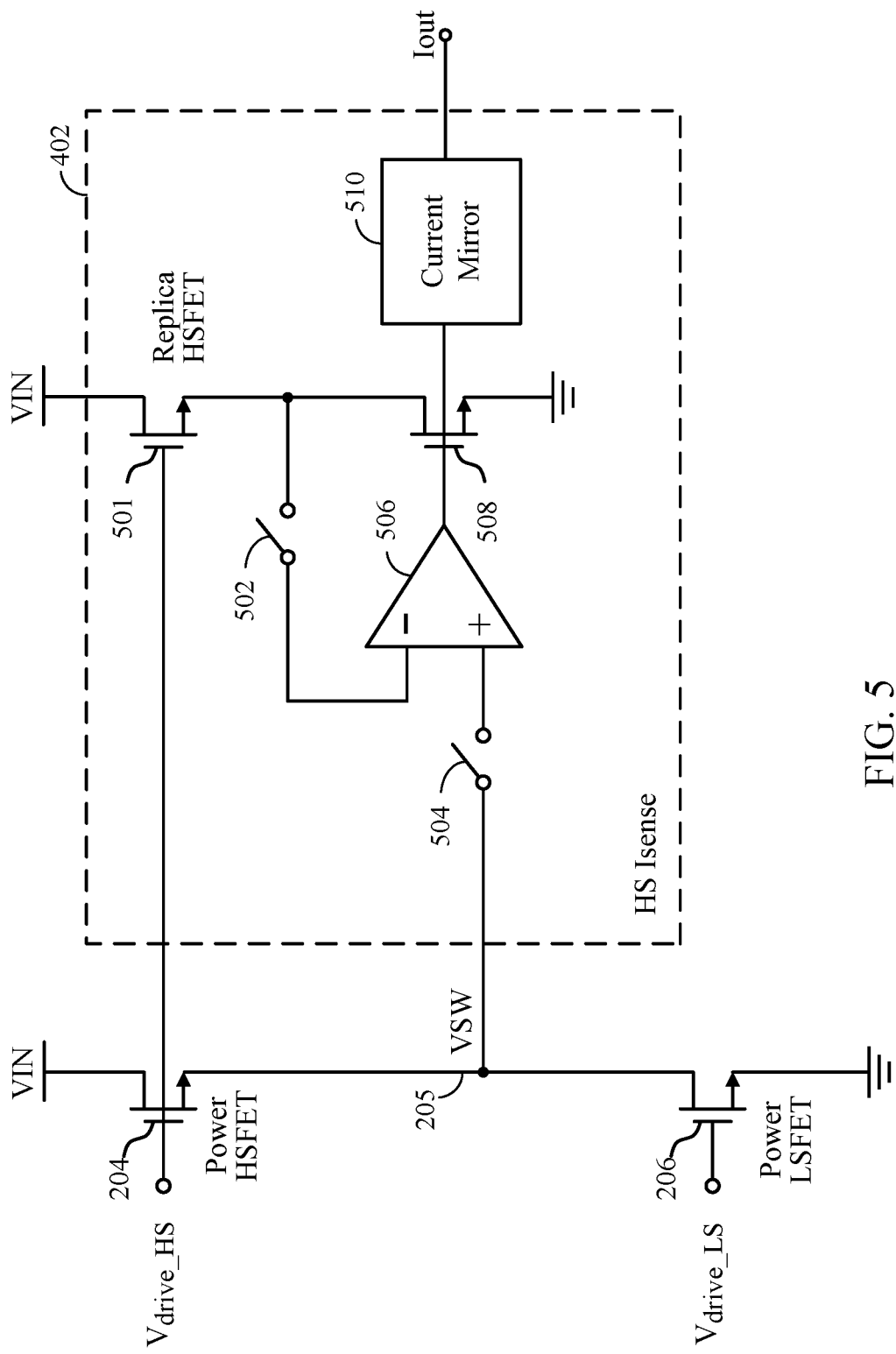
FIG. 5 is a block diagram of an example high-side current-sensing amplifier coupled to high-side and low-side transistors of a buck converter, in accordance with certain aspects of the present disclosure.

FIG. 5 a block diagram of an example circuit internal to HS Isense 402, in accordance with certain aspects of the present disclosure. The internal circuit includes a replica HSFET 501, switches 502 and 504, amplifier 506, transistor 508, and current mirror 510. The replica HSFET 501 (also referred to as the "pilot HSFET") may use the same technology as the HSFET 204 (which may be referred to as the "power HSFET" to distinguish from the replica HSFET), but with a much smaller channel width for lower current capability for the same gate-to-source voltage ($V_{GS}$). The drain of the replica HSFET 501 is connected to the same input voltage as the HSFET 204 (in this case, VIN). The amplifier 506 has an output configured to drive the gate of transistor 508, which has a drain connected with the source of the replica HSFET 501. The source of transistor 508 may be connected to the reference potential node (e.g., electrical ground) for the HS Isense 402. The negative input of the amplifier 506 is selectively coupled (via switch 502) to the source of the replica HSFET 501, and the positive input of the amplifier 506 is selectively coupled (via switch 504) to switch node 205. In this manner, the amplifier 506 will drive transistor 508 such that the source voltage of the replica HSFET 501 will match the source voltage of the HSFET 204. In this manner, because the gate drive voltage is the same for both the replica HSFET 501 and the HSFET 204, the $V_{GS}$ of the replica HSFET 501 will match the $V_{GS}$ of the HSFET 204, and the current through the replica HSFET 501 will be proportional to (and smaller than) the current through the HSFET 204. The output of the amplifier 506 is also coupled to the input (e.g., a gate drive for a current source transistor) of the current mirror 510. The current mirror 510 will produce an output current that is proportional to the input current. Therefore, the HS Isense 402 may be considered as having a constant current gain (β) that is much less than 1, such that the controlled output current (Iout) produced is much smaller than the controlling input current through the HSFET 204. The switches 502 and 504 may be used to decouple the inputs to the amplifier 506 from the sources of the replica HSFET 501 and the HSFET 204, respectively, when the replica HSFET 501 and the HSFET 204 are turned off. During this time, the inputs to the amplifier 506 may be coupled (e.g., via other switches not shown) to other nodes, such as to the input voltage node (VIN). Those skilled in the art will understand that the internal circuit of FIG. 5 is only one example of a current-sensing amplifier and that there are other topologies to implement a current-sensing amplifier or ways to produce an output current that is proportional to the HSFET current.

Returning to FIG. 4, the time-based graph 450 depicts an example waveform 303 of inductor current and the timing of different states of the current-sensing circuit 400, in accordance with certain aspects of the present disclosure. Similar to graph 300, the graph 450 illustrates waveform 303 representing current (e.g., in amperes) through the inductor (e.g., inductor L2) of a buck converter plotted on the y-axis as a function of time (e.g., in nanoseconds, or ns) along the x-axis. Waveform 303 illustrates a little more than one full switching cycle of the buck converter and is shown with five different times ($t_{I0}$, $t_{I1}$, $t_{I2}$, $t_{I3}$, and $t_{I0'}$) indicating the beginning and end of four different phases of operation of the circuit 400 for each switching cycle: a high-side error phase (time $t_{I0}$ to time $t_{I1}$), a high-side current-sensing phase (time $t_{I1}$ to time $t_{I2}$), a low-side error phase (time $t_{I2}$ to time $t_{I3}$), and a low-side current-sensing phase (time $t_{I3}$ to time $t_{I0'}$). Time $t_{I0'}$ is similar to time $t_{I0}$, but for a subsequent switching cycle. Thus, events that happen at time $t_{I0}$ may be repeated at time $t_{I0'}$ to begin the next switching cycle.

Figure 6:
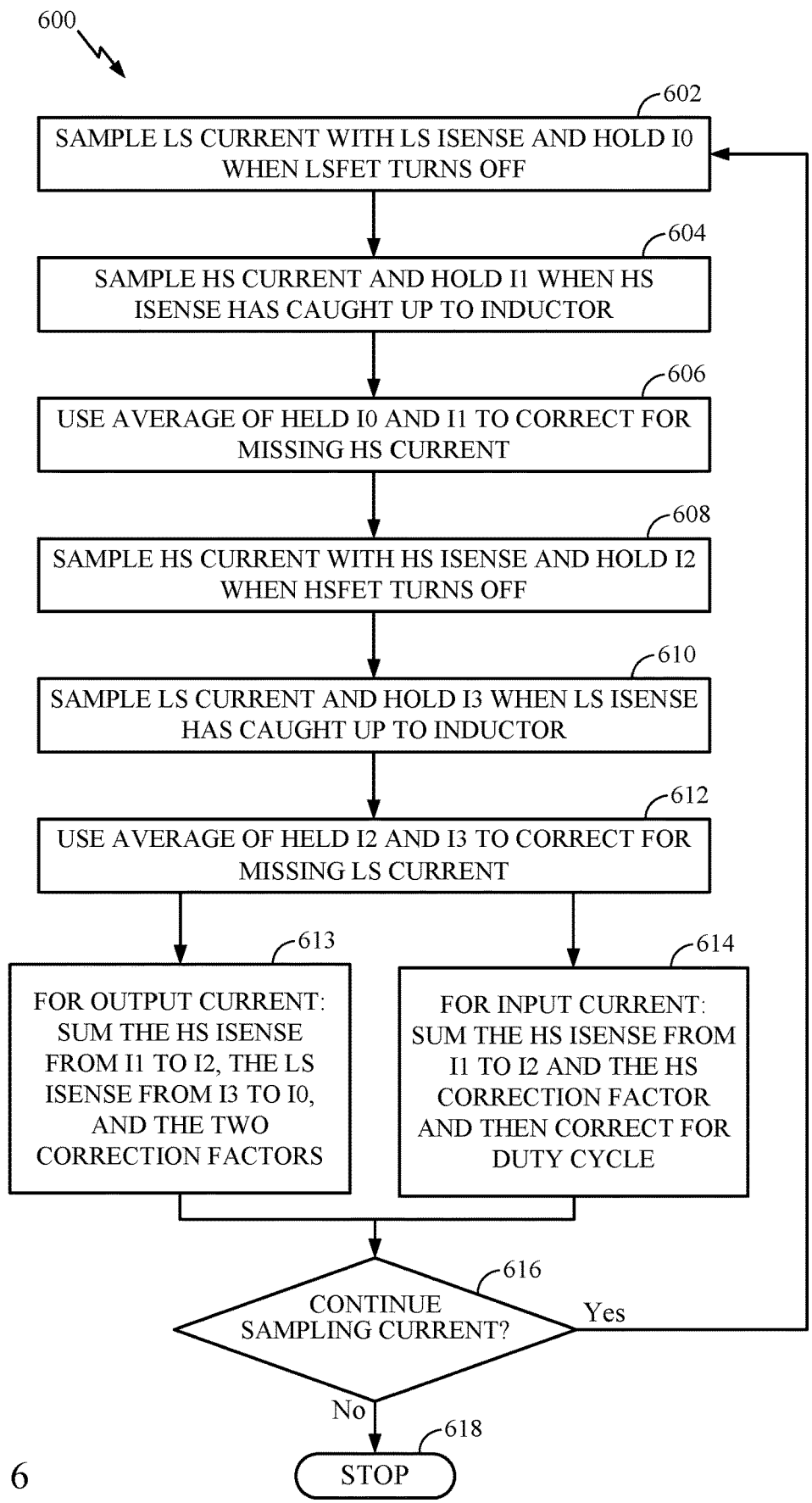
FIG. 6 is a flow diagram depicting an error-correction process for accurately sensing average input current and/or average output current in a buck converter, in accordance with certain aspects of the present disclosure.

FIG. 6 is a flow diagram of an example process 600 for accurately sensing average input current and/or average output current in a switched-mode power supply (e.g., a buck converter), in accordance with certain aspects of the present disclosure. Additional, fewer, or different operations may be performed, depending on the implementation of the process 600. The process 600 may be implemented by a system such as the current-sensing circuit 400 of FIG. 4, the current-sensing circuit 700 of FIG. 7A, or the current-sensing circuit 720 of FIG. 7C.

The process 600 may begin, at operation 602, with the system turning on the HSFET and turning off the LSFET. Also at operation 602, the system effectively holds the sampled inductor current value I0 (being sensed by the LS Isense 404 and turned into a voltage by the resistive element 406) at time $t_{I0}$ using sample-and-hold circuit 408 (labeled "S/H I0"). Switch S1 may also be opened at operation 602.

After waiting a blanking time, the system connects the input of the HS Isense 402 to measure the current associated with the HSFET (e.g., through the replica HSFET). The HS Isense 402 may have slew-rate limitations that do not allow the HS Isense to follow the high-side switch current accurately. This slew-rate error can be very large, especially at high switching frequencies with short HSFET on-times. Therefore, after a suitable delay t1 (e.g., a catch-up time or settling interval for the current-sensing amplifier), the system holds the sampled output of the HS Isense 402 at operation 604, to effectively capture the inductor current value I1 (as a voltage) at time $t_{I1}$ using sample-and-hold circuit 410 (labeled "S/H I1"). The delay t1 may be any suitable interval to allow for the blanking time and the slew-rate-limited time of the HS Isense 402 to pass. The t1 interval should be chosen to be longer than the sum of the HS Isense blanking time and the slew-rate-limited time. For example, if the HS Isense 402 takes 100 ns to catch up to the HSFET current, then the t1 interval should be chosen to be longer than 100 ns. Also at operation 604, the system may close switch S1, and the low-pass filter or error amplifier 420 may measure the rising inductor current sensed by the HS Isense 402 (and converted to a voltage by resistive element 406) between time $t_{I1}$ and time $t_{I2}$.

At operation 606, the averaging and voltage-to-current converting circuit 416 may average the captured I0 and I1 values and convert the averaged value back to a current, representing a high-side error-correction current. The averaging and voltage-to-current converting circuit 416 may have a transconductance ($g_m$) equal to the inverse of the resistance of the resistive element 406 ($g_m=1/R1$). In this manner, the high-side error-correction current is on the same scale as the sensed current output by the HS Isense 402, such that the currents can be accurately combined at the current-summing node 421. For a subsequent switching cycle, switch S3 may be closed (e.g., for the same amount of time as the delay t1, sometime during the interval between $t_{I1'}$ and $t_{I2'}$, or in some cases, the interval between $t_{I3'}$ and $t_{I0''}$) to supply the high-side error-correction current as the current information missing during the time between $t_{I0'}$ and $t_{I1'}$. During the interval between $t_{I1'}$ and $t_{I2'}$ (or between $t_{I3'}$ and $t_{I0''}$), switch S1 is also closed, and the output current from the HS Isense 402 (or the LS Isense 404) is being combined at the current-summing node 421 with the high-side error-correction current. The combined current flows into resistive element 406 when switches S1 and S3 are closed. The combined current may be converted to a voltage by resistive element 406, and this voltage may be supplied via sensing node 422 to the low-pass filter and error amplifier 420.

The process 600 may continue, at operation 608, for the same switching cycle as operations 602 and 604, with the system turning off the HSFET and turning on the LSFET. Also at operation 608, the system effectively holds the sampled inductor current value I2 (being sensed by the HS Isense 402 and turned into a voltage by the resistive element 406) at time $t_{I2}$ using sample-and-hold circuit 412 (labeled "S/H I2"). Switch S1 may also be opened at operation 608.

After waiting a blanking time, the system connects the input of the LS Isense 404 to measure the current associated with the LSFET (e.g., through the replica LSFET). After a suitable delay t2 (e.g., a catch-up time or settling interval), the system holds the sampled output of the LS Isense 404 at operation 610, to effectively capture the inductor current value I3 (as a voltage) at time $t_{I3}$ using sample-and-hold circuit 414 (labeled "S/H I3"). Also at operation 610, the system may close switch S1, and the low-pass filter or error amplifier 420 may measure the falling inductor current sensed by the LS Isense 404 (and converted to a voltage by resistive element 406) between time $t_{I3}$ and time $t_{I0'}$.

At operation 612, the averaging and voltage-to-current converting circuit 418 may average the captured I2 and I3 values and convert the averaged value back to a current, representing a low-side error-correction current. The averaging and voltage-to-current converting circuit 418 may have a transconductance ($g_m$) equal to the inverse of the resistance of the resistive element 406 ($g_m=1/R1$). In this manner, the low-side error-correction current is on the same scale as the sensed current output by the LS Isense 404, such that the currents can be accurately combined at the current-summing node 421. For a subsequent switching cycle, switch S2 may be closed (e.g., for the same amount of time as the delay t2, sometime during the interval between $t_{f3'}$ and $t_{f0'''}$, or in some cases, the interval between $t_{f1'}$ and $t_{f2'}$) to supply the low-side error-correction current as the current information missing during the time between $t_{f2'}$ and $t_{f3''}$. During the interval between $t_{f3'}$ and $t_{f0'''}$ (or between $t_{f1'}$ and $t_{f2'}$), switch S1 is also closed, and the output current from the LS Isense 404 (or the HS Isense 402) is being combined at the current-summing node 421 with the low-side error-correction current. The combined current flows into resistive element 406 when switches S1 and S2 are closed. The combined current may be converted to a voltage by resistive element 406, and this voltage may be supplied via sensing node 422 to the low-pass filter and error amplifier 420.

To determine the average output current at operation 613 for the current switching cycle (e.g., for the same switching cycle as operations 602, 604, 608, and 610), the system may sum: (1) the rising inductor current sensed by the HS Isense 402 (e.g., the current through S1) between time $t_{f1}$ and time $t_{f2}$ for the current switching cycle; (2) the high-side error-correction current (e.g., from a previous switching cycle) applied through switch S3 for the same amount of time as the delay t1; (3) the falling inductor current sensed by the LS Isense 404 (e.g., the current through S1) between time $t_{f3}$ and time $t_{f0'}$ for the current switching cycle; and (4) the low-side error-correction current (e.g., from a previous switching cycle) applied through switch S2 for the same amount of time as the delay t2. In other words, the system adds the two areas under the waveform 303 with known-good current information (e.g., the areas between time $t_{f1}$ and time $t_{f2}$ and between time $t_{f3}$ and time $t_{f0'}$) combines this with an average of each of the two areas under the waveform 303 with missing current information (e.g., due to blanking times and/or slew-rate limitations of the current-sensing amplifiers) to obtain an accurate total area under the waveform 303 for the current switching cycle. The combined total area under the waveform 303 for the current switching cycle may then be divided by the switching period (Ts) (or alternatively, multiplied by the switching frequency) to accurately calculate the average output current for the current switching cycle.

To determine the average input current at operation 614 for the current switching cycle, the system may sum: (1) the rising inductor current sensed by the HS Isense 402 between time $t_{f1}$ and time $t_{f2}$ for the current switching cycle; and (2) the high-side error-correction current (e.g., from a previous switching cycle) applied through switch S3 for the same amount of time as delay t1. For certain aspects, the system may correct the average input current for the duty cycle (e.g., apply a correction factor based on the duty cycle for the current switching cycle and/or on the previous switching cycle).

At operation 616, the system checks whether to continue sampling current. If yes, then the system proceeds back to operation 602 to repeat process 600; otherwise, the system proceeds to operation 618 to stop process 600.

For certain aspects, the average output currents from multiple switching cycles may be averaged to calculate a more accurate average output current for the switched-mode power supply. Likewise, for certain aspects, the average input currents from multiple switching cycles may be averaged to calculate a more accurate average input current for the switched-mode power supply.

Figure 7A:
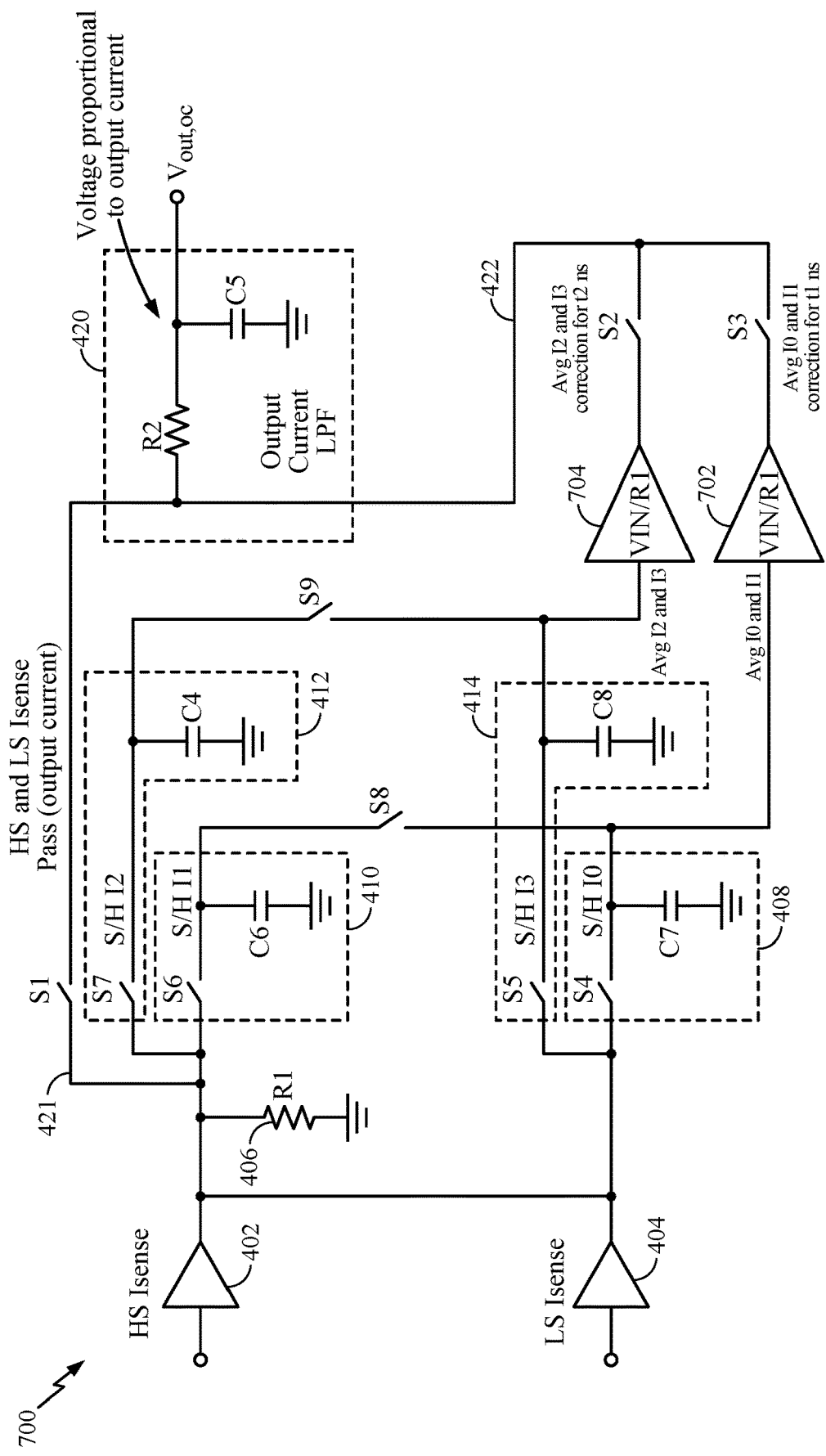
FIGS. 7A and 7B are a schematic diagram of an example current-sensing circuit with error-correction components for accurately sensing average output current and an associated time-based graph, respectively, in accordance with certain aspects of the present disclosure.
Figure 7D:
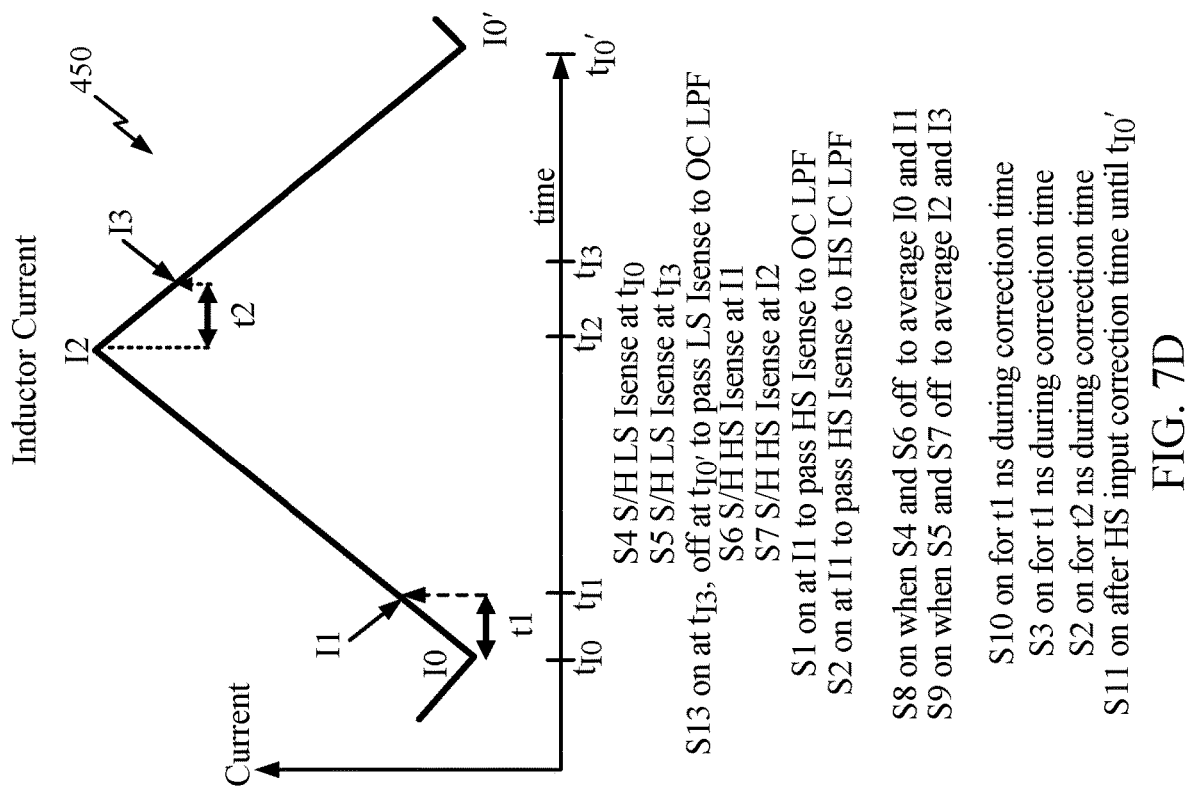
FIGS. 7C and 7D are a schematic diagram of an example current-sensing circuit with error-correction components for accurately sensing average input current and an associated time-based graph, respectively, in accordance with certain aspects of the present disclosure.
Figure 7B:
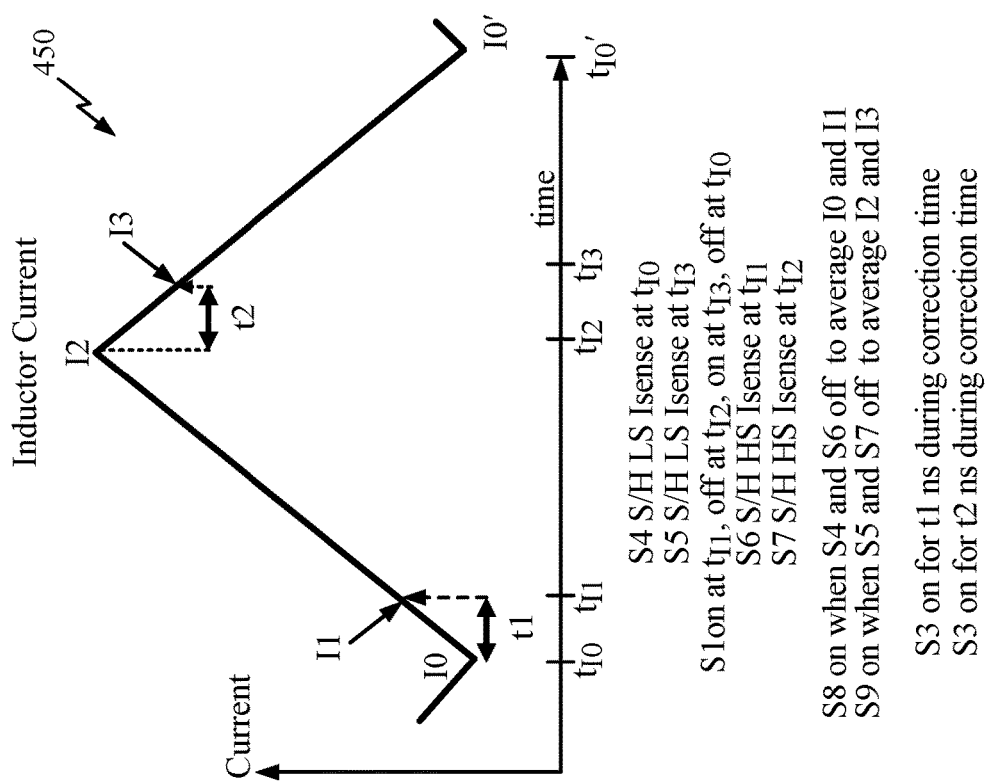

FIG. 7A is a schematic diagram of an example current-sensing circuit 700 with error-correction components for accurately sensing average output current, in accordance with certain aspects of the present disclosure. FIG. 7B is a time-based graph associated with the current-sensing circuit 700 of FIG. 7A. The current-sensing circuit 700 may implement the current-sensing circuit 400 of FIG. 4. For example, the low-pass filter or error amplifier 420 may be implemented by a resistive element R2 and a capacitive element C5 to form a first-order, passive low-pass filter. The output voltage ($V_{out,oc}$) of this low-pass filter may have a voltage proportional to the output current of the buck converter, and hence, this low-pass filter may be referred to as an output current low-pass filter. The sample-and-hold circuit 408 (S/H I0) may be implemented with a series switch S4 and a shunt capacitive element C7, the sample-and-hold circuit 410 (S/H I1) may be implemented with a series switch S6 and a shunt capacitive element C6, the sample-and-hold circuit 412 (S/H I2) may be implemented with a series switch S7 and a shunt capacitive element C4, and the sample-and-hold circuit 414 (S/H I3) may be implemented with a series switch S5 and a shunt capacitive element C8. The averaging and voltage-to-current converting circuit 416 may be implemented in circuit 700 by a switch S8 and a transconductance amplifier 702. The averaging and voltage-to-current converting circuit 418 may be implemented by a switch S9 and a transconductance amplifier 704. The transconductance amplifiers 702 and 704 may each have a gain of VIN/R1, where VIN is the input voltage to the buck converter and R1 is the resistance of the resistive element 406.

During operation of the circuit 700, switch S4 is opened at $t_{f0}$ such that capacitive element C7 will hold the value I0 of the current sensed by the LS Isense 404. Also at or around $t_{f0}$, the LSFET is turned off, the HSFET is turned on, the LS Isense 404 is disabled, the HS Isense 402 is enabled, switches S6 and S7 are closed to begin sampling the current sensed by HS Isense, switches S1 and S9 are opened, and switches S2, S3, S5, and S8 remain open.

At $t_{f1}$, switch S6 is opened such that capacitive element C6 will hold the value I1 of the current sensed by the HS Isense 402. Also at or around $t_{f1}$, switch S1 is closed, switch S7 remains closed, and switches S4, S5, and S9 remain open. Furthermore, switch S8 is closed at $t_{f1}$ to begin averaging the current values I0 and I1 (stored on capacitive elements C7 and C6, respectively) for application in a subsequent switching cycle.

Sometime during the interval between $t_{f1}$ and $t_{f2}$ (or between $t_{f3}$ and $t_{f0'}$), switch S3 is closed to apply a high-side error-correction current from a previous switching cycle, as output by the transconductance amplifier 702, for a first predetermined period. The first predetermined period may be the same amount of time as delay $t_1$. After application of the high-side error-correction current for the first predetermined period, switch S3 is opened.

At $t_{f2}$, switch S7 is opened such that capacitive element C4 will hold the value I2 of the current sensed by the HS Isense 402. Also at or around $t_{f2}$, the HSFET is turned off, the LSFET is turned on, the HS Isense 402 is disabled, the LS Isense 404 is enabled, switches S4 and S5 are closed to begin sampling the current sensed by the LS Isense, switches S1 and S8 are opened, and switches S2, S3, S6, and S9 remain open.

At $t_{f3}$, switch S5 is opened such that capacitive element C8 will hold the value I3 of the current sensed by the LS Isense 404. Also at or around $t_{f1}$, switch S1 is closed, switch S4 remains closed, and switches S6, S7, and S8 remain open. Furthermore, switch S9 is closed at $t_{f3}$ to average the current values I2 and I3 (stored on capacitive elements C4 and C8, respectively) for application in a subsequent switching cycle.

Sometime during the interval between $t_{I3}$ and $t_{I0'}$ (or between $t_{I1}$ and $t_{I2}$), switch S2 is closed to apply a low-side error-correction current from a previous switching cycle, as output by the transconductance amplifier 704, for a second predetermined period. The second predetermined period may be the same amount of time as delay $t_2$. After application of the low-side error-correction current for the second predetermined period, switch S2 is opened. For certain aspects, switches S2 and S3 may be temporarily closed during different intervals, whereas in other aspects, switches S2 and S3 may be temporarily closed during the same interval.

Although only a first-order passive low-pass filter is illustrated in FIG. 7A, those having ordinary skill in the art understand that the low-pass filter may be implemented by any number of different low-pass filter topologies, may be active or passive, and may be more complex than first order. For example, the low-pass filter may be implemented by an integrator, which can function as a low-pass filter. Such an integrator may be part of a control circuit that implements an active input current limit, which may be specified for certain applications (e.g., battery charging applications). Alternatively, the output of the low-pass filter may be used directly as a real-time measurement of average output current.

Figure 7C:
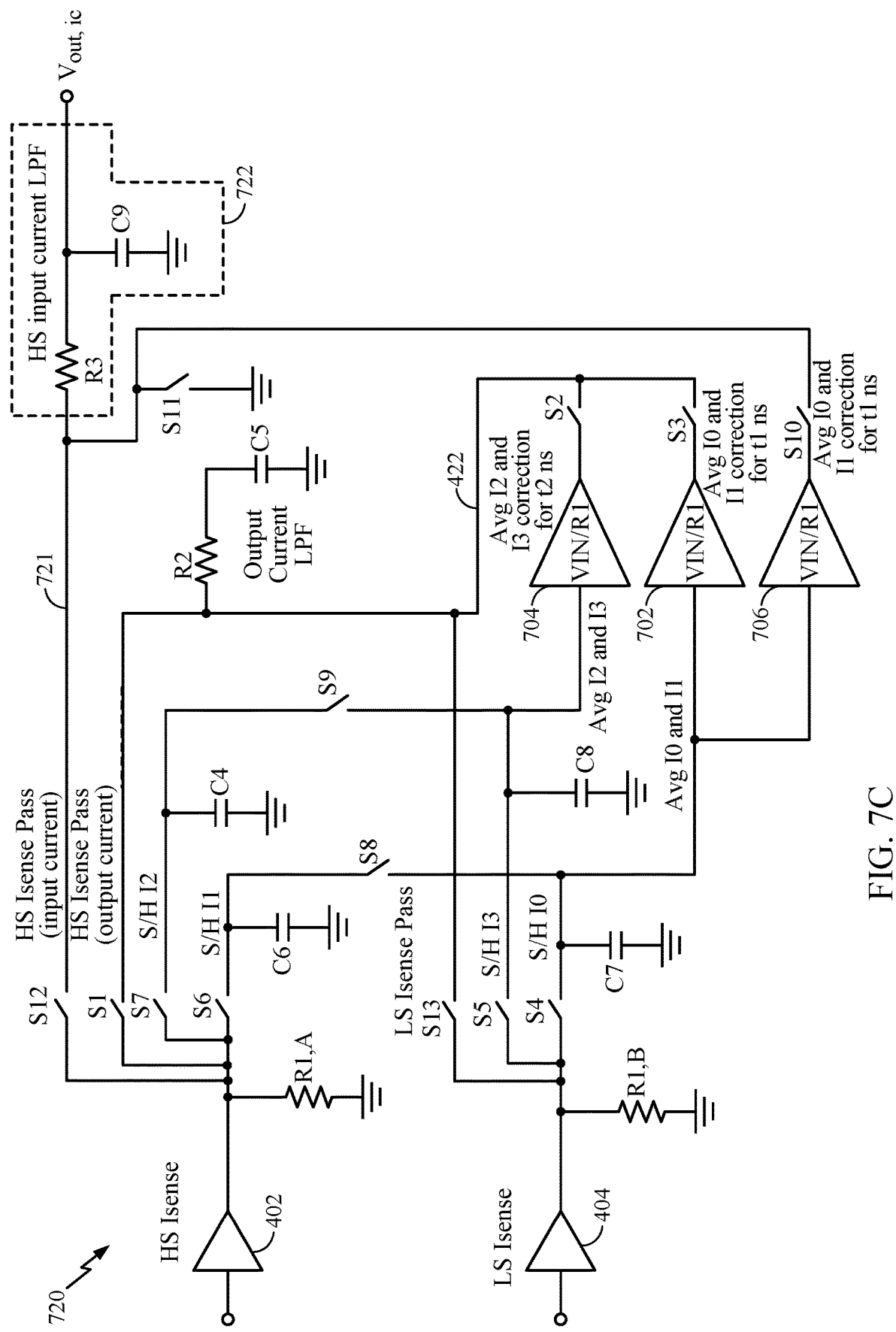

FIG. 7C is a schematic diagram of an example current-sensing circuit 720 with error-correction components for accurately sensing average input current, in accordance with certain aspects of the present disclosure. FIG. 7D is a time-based graph associated with the current-sensing circuit 720 of FIG. 7C. The current-sensing circuit 720 may implement the current-sensing circuit 400 of FIG. 4 and adds components to the current-sensing circuit 700 of FIG. 7A. These additional components include a resistive element R3, a capacitive element C9, switches S10, S11, S12, and S13, and a transconductance amplifier 706. Resistive element R3 and capacitive element C9 may form a first-order, passive low-pass filter 722 for measuring the high-side input current at an input-current-sensing node 721 via switch S12. The output voltage ($V_{out,ic}$) of the low-pass filter 722 may have a voltage proportional to the input current of the buck converter, and hence, this low-pass filter may be referred to as an input current low-pass filter. Furthermore, the transconductance amplifier 706 may have a gain of VIN/R1, similar to the transconductance amplifiers 702 and 704.

For certain aspects as illustrated in FIG. 7C, resistive element 406 is replicated, such that there is a shunt resistive element R1,A at the output of the HS Isense 402 and another shunt resistive element R1,B at the output of the LS Isense 404, both having a resistance R1. For other aspects, the outputs of the HS Isense 402 and the LS Isense 404 may share the single resistive element 406 (as illustrated in FIG. 7A), in which case switch S13 may be eliminated from the current-sensing circuit 720 of FIG. 7C.

During operation of the circuit 720, switch S4 is opened at $t_{I0}$ such that capacitive element C7 will hold the value I0 of the current sensed by the LS Isense 404. Also at or around $t_{I0}$, the LSFET is turned off, the HSFET is turned on, the LS Isense 404 is disabled, the HS Isense 402 is enabled, switches S6 and S7 are closed to begin sampling the current sensed by HS Isense, switches S9, S11, and S13 are opened, and switches S1, S2, S3, S5, S8, S10, and S12 remain open.

At $t_{I1}$, switch S6 is opened such that capacitive element C6 will hold the value I1 of the current sensed by the HS Isense 402. Also at or around $t_{I1}$, switches S1 and S12 are closed, switch S7 remains closed, and switches S4, S5, S9, S11, and S13 remain open. Furthermore, switch S8 is closed at $t_{I1}$ to begin averaging the current values I0 and I1 (stored on capacitive elements C7 and C6, respectively) for application in a subsequent switching cycle.

Sometime during the interval between $t_{I1}$ and $t_{I2}$ (or between $t_{I3}$ and $t_{I0'}$), switch S3 is closed to apply a high-side error-correction current from a previous switching cycle, as output by the transconductance amplifier 702, for a first predetermined period, as described above. After application of the high-side error-correction current for the first predetermined period, switch S3 is opened. Furthermore, sometime during the interval between $t_{I1}$ and $t_{I2}$ while switch S12 is closed, switch S10 is closed to apply a high-side error-correction current from a previous switching cycle, as output by the transconductance amplifier 706, for a third predetermined period. The third predetermined period may be the same amount of time as delay $t_1$. After application of the high-side error-correction current for the third predetermined period, switch S10 is opened. For certain aspects, switches S3 and S10 may be temporarily closed during the same interval, whereas in other aspects, switches S3 and S10 may be temporarily closed during different intervals.

At $t_{I2}$, switch S7 is opened such that capacitive element C4 will hold the value I2 of the current sensed by the HS Isense 402. Also at or around $t_{I2}$, the HSFET is turned off, the LSFET is turned on, the HS Isense 402 is disabled, the LS Isense 404 is enabled, switches S4 and S5 are closed to begin sampling the current sensed by the LS Isense, switches S1, S8, and S12 are opened, and switches S2, S3, S6, S9, S10, S11, and S13 remain open.

At $t_{I3}$, switch S5 is opened such that capacitive element C8 will hold the value I3 of the current sensed by the LS Isense 404. Also at or around $t_{I3}$, switch S13 is closed, switch S4 remains closed, and switches S1, S6, S7, S8, and S12 remain open. Also, switch S11 is closed to discharge capacitive element C9, while the high-side current is not being sensed. Furthermore, switch S9 is closed at $t_{I3}$ to average the current values I2 and I3 (stored on capacitive elements C4 and C8, respectively) for application in a subsequent switching cycle.

Sometime during the interval between $t_{I3}$ and $t_{I0'}$ (or between $t_{I1}$ and $t_{I2}$), switch S2 is closed to apply a low-side error-correction current from a previous switching cycle, as output by the transconductance amplifier 704, for a second predetermined period, as described above. After application of the low-side error-correction current for the second predetermined period, switch S2 is opened. For certain aspects, switches S2 and S3 may be temporarily closed during different intervals, whereas in other aspects, switches S2 and S3 may be temporarily closed during the same interval.

Battery chargers may include a scheme to disconnect the battery (e.g., battery 102) when the input voltage (e.g., VIN) is shorted to ground. Without this protection, the body diode of the HSFET in the buck converter or other SMPS will conduct current, regardless whether the HSFET is on or off. Therefore, to implement aspects of the present disclosure in a battery charger, the body diode of the HSFET may be controlled (e.g., with a switch) to open the body diode when high reverse currents are detected.

A capacitive element, as described herein, may be implemented by one or more capacitors, for example. A capacitor may be a fixed capacitor or a variable capacitor and may be, for example, an electrolytic capacitor, an aluminum electrolytic capacitor, a tantalum electrolytic capacitor, a super capacitor, a ceramic capacitor, a power film capacitor, polypropylene capacitor, a polycarbonate capacitor, a silver mica capacitor, an integrated-circuit (IC) capacitor, a double-layer capacitor, a pseudo-capacitor, or hybrid capacitors. The capacitors in circuits 400, 700, and 720 may be any suitable capacitance value, for example, in the range of picofarads (pF), nanofarads (nF), or microfarads (µF).

A resistive element, as described herein, may be implemented by one or more resistors, for example. A resistor may be a fixed resistor or a variable resistor (e.g., adjustable resistor, potentiometer, resistance decade box, or a thermistor). A resistor may have any resistance, for example, in the range of ohms (Ω), kilo-ohms (kΩ), or mega-ohms (MΩ).

Figure 8:
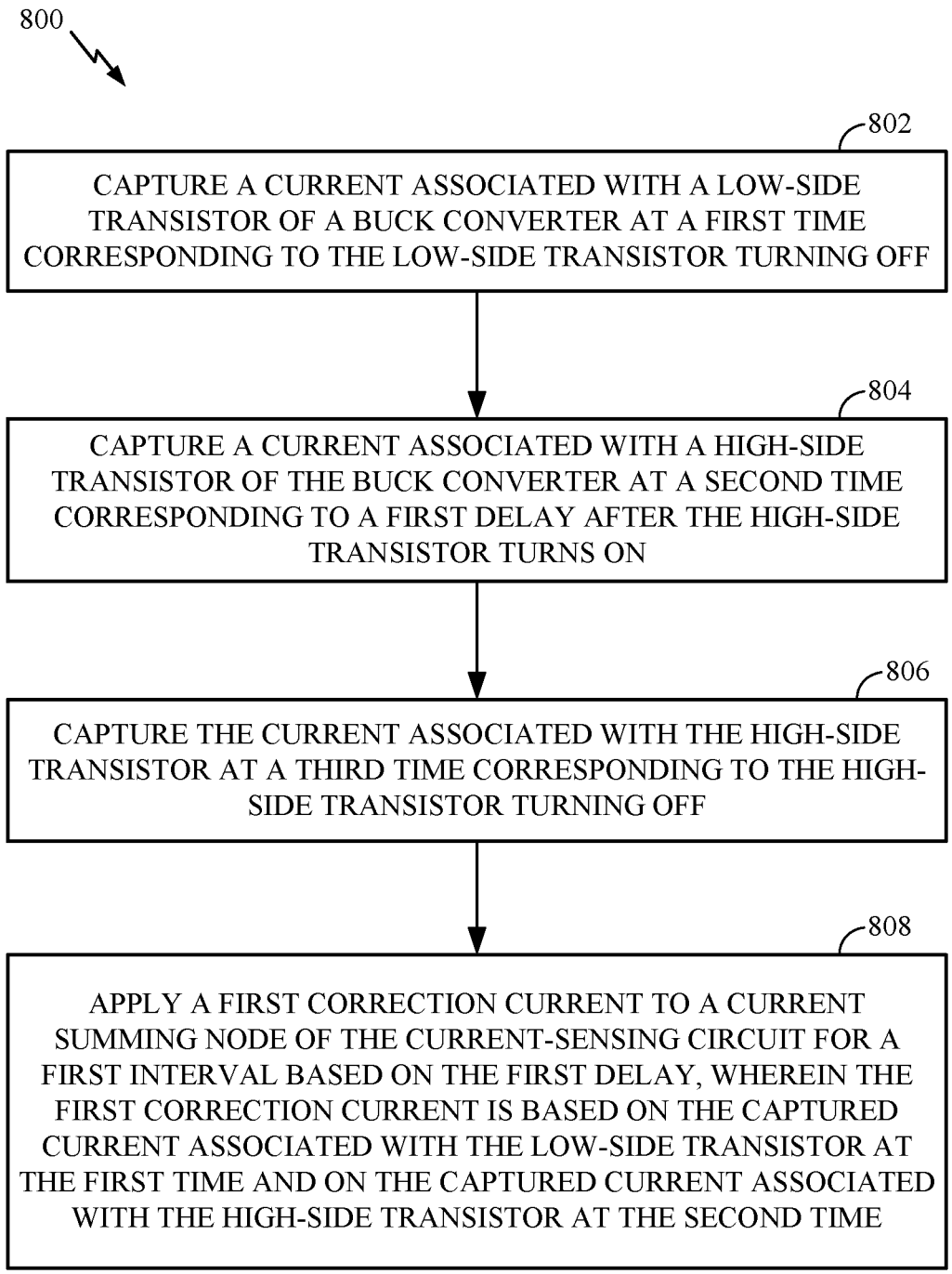
FIG. 8 is a flow diagram of example operations for current sensing and correction in a switched-mode power supply, in accordance with certain aspects of the present disclosure.

FIG. 8 is a flow diagram of an example process 800 for current sensing and correction in a switched-mode power supply (e.g., a buck converter, a boost converter, or a buck-boost converter), in accordance with certain aspects of the present disclosure. Additional, fewer, or different operations may be performed, depending on the implementation of the process 800. The process 800 may be implemented by a system, such as the current-sensing circuit 400 of FIG. 4, the circuit 700 of FIG. 7A, or the circuit 720 of FIG. 7C, where it is understood that the switched-mode power supply comprises a high-side transistor (e.g., HSFET 204) coupled to a low-side transistor (e.g., LSFET 206). The system may also include a controller for controlling the states of the various transistors and switches therein.

The process 800 may begin, at operation 802, with the system capturing (e.g., holding after sampling) a current associated with the low-side transistor at a first time (e.g., $t_{f0}$) corresponding to the low-side transistor turning off. At operation 804, the system captures a current associated with the high-side transistor at a second time (e.g., $t_{f1}$) corresponding to a first delay (e.g., t1) after the high-side transistor turns on. At operation 806, the system captures the current associated with the high-side transistor at a third time (e.g., $t_{f2}$) corresponding to the high-side transistor turning off. At operation 808, the system applies a first correction current to a current-summing node (e.g., node 421) of the current-sensing circuit for a first interval based on the first delay. The first correction current may be based on the captured current associated with the low-side transistor at the first time and on the captured current associated with the high-side transistor at the second time.

According to certain aspects, the first delay is based on a blanking time and a settling time for a high-side current-sensing amplifier (e.g., HS Isense 402) coupled to the high-side transistor, such that the high-side current-sensing amplifier corresponds to an inductor current (e.g., IL through inductor L2) for the switched-mode power supply by the second time.

According to certain aspects, the process 800 may further involve the system averaging the captured current associated with the low-side transistor at the first time and the captured current associated with the high-side transistor at the second time to obtain an averaged current. In this case, the first correction current may be the averaged current.

According to certain aspects, the first interval equals the first delay.

According to certain aspects, the process 800 may further involve the system determining an average input current for the switched-mode power supply based on the first correction current, the captured current associated with the high-side transistor at the second time, the captured current associated with the high-side transistor at the third time, and a duty cycle of the switched-mode power supply.

According to certain aspects, the process 800 may further involve the system capturing the current associated with the low-side transistor at a fourth time (e.g., $t_{f3}$) corresponding to a second delay (e.g., t2) after the low-side transistor turns on; and applying a second correction current to the current-summing node for a second interval based on the second delay. In this case, the second correction current may be based on the captured current associated with the high-side transistor at the third time and on the captured current associated with the low-side transistor at the fourth time. For certain aspects, the second delay is based on a blanking time and a settling time for a low-side current-sensing amplifier (e.g., LS Isense 404) coupled to the low-side transistor, such that the low-side current-sensing amplifier corresponds to an inductor current for the switched-mode power supply by the fourth time. For certain aspects, the process 800 may further entail the system averaging the captured current associated with the high-side transistor at the third time and the captured current associated with the low-side transistor at the fourth time to obtain an averaged current. In this case, the second correction current may be the averaged current. For certain aspects, the second interval equals the second delay. For certain aspects, the first time, the second time, the third time, and the fourth time occur during a first switching period of the switched-mode power supply; the first interval occurs during a second switching period of the switched-mode power supply while the high-side transistor is turned on; the second switching period is subsequent to the first switching period; and the second interval occurs during the second switching period of the switched-mode power supply while the low-side transistor is turned on. For certain aspects, the process 800 may further include the system capturing the current associated with the low-side transistor at a fifth time (e.g., $t_{f0'}$) corresponding to the low-side transistor turning off, wherein a time difference between the fifth time and the first time is one switching period (e.g., Ts) for the switched-mode power supply; and determining an average output current for the switched-mode power supply based on the first correction current, the captured current associated with the high-side transistor at the second time, the captured current associated with the high-side transistor at the third time, the second correction current, the captured current associated with the low-side transistor at the fourth time, and the captured current associated with the low-side transistor at the fifth time.

An Example Device

It should be understood that aspects of the present disclosure may be used in a variety of applications. Although the present disclosure is not limited in this respect, the circuits disclosed herein may be used in many apparatuses such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radio-telephone communication systems, satellite communication systems, two-way radio communication systems, one-way pagers, two-way pagers, personal communication systems (PCS), personal digital assistants (PDAs), and the like.

Figure 9:
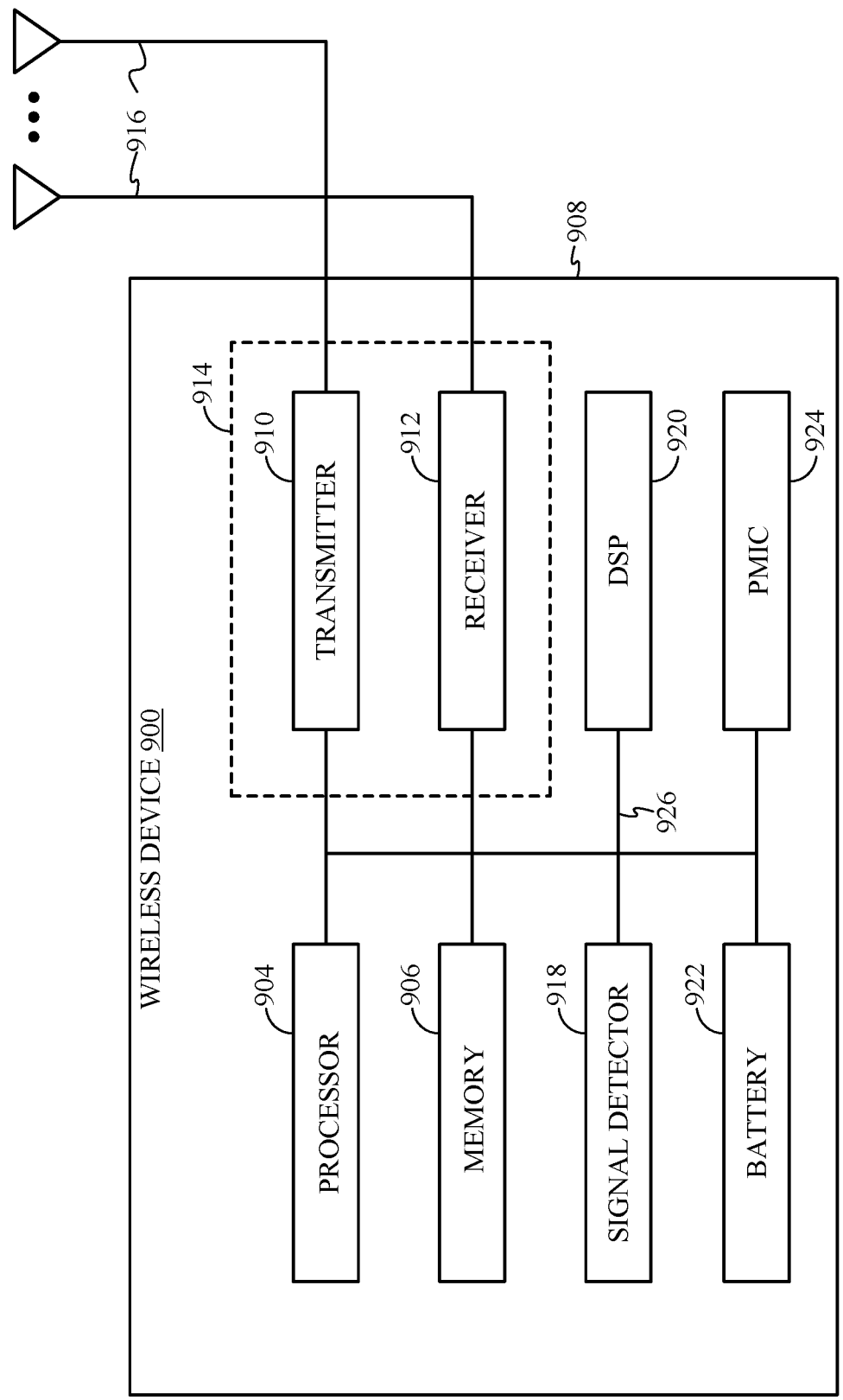
FIG. 9 is a block diagram of an example device comprising a power management integrated circuit (PMIC) that includes and/or controls one or more switching regulators with current-sensing and error-correction circuitry, in accordance with certain aspects of the present disclosure.

FIG. 9 illustrates an example device 900 in which aspects of the present disclosure may be implemented. The device 900 may be a battery-operated device such as a cellular phone, a PDA, a handheld device, a wireless device, a laptop computer, a tablet, a smartphone, etc.

The device 900 may include a processor 904 that controls operation of the device 900. The processor 904 may also be referred to as a central processing unit (CPU). Memory 906, which may include both read-only memory (ROM) and random access memory (RAM), provides instructions and data to the processor 904. A portion of the memory 906 may also include non-volatile random access memory (NVRAM). The processor 904 typically performs logical and arithmetic operations based on program instructions stored within the memory 906.

In certain aspects, the device 900 may also include a housing 908 that may include a transmitter 910 and a receiver 912 to allow transmission and reception of data between the device 900 and a remote location. For certain aspects, the transmitter 910 and receiver 912 may be combined into a transceiver 914. One or more antennas 916 may be attached or otherwise coupled to the housing 908 and electrically connected to the transceiver 914. The device 900 may also include (not shown) multiple transmitters, multiple receivers, and/or multiple transceivers.

The device 900 may also include a signal detector 918 that may be used in an effort to detect and quantify the level of signals received by the transceiver 914. The signal detector 918 may detect such signal parameters as total energy, energy per subcarrier per symbol, and power spectral density, among others. The device 900 may also include a digital signal processor (DSP) 920 for use in processing signals.

The device 900 may further include a battery 922 used to power the various components of the device 900. The device 900 may also include a power management integrated circuit (power management IC or PMIC) 924 for managing the power from the battery to the various components of the device 900. The PMIC 924 may perform a variety of functions for the device such as DC-to-DC conversion, battery charging, power-source selection, voltage scaling, power sequencing, etc. In certain aspects, the PMIC 924 may include and/or control one or more switching regulators with current sensing and error-correction circuitry, as described above. The various components of the device 900 may be coupled together by a bus system 926, which may include a power bus, a control signal bus, and/or a status signal bus in addition to a data bus.

Certain aspects of the present disclosure are directed to techniques and apparatus for sensing average input current and/or average output current in a switched-mode power supply (SMPS) with accurate and lossless sensing. Such techniques offer better efficiency and are immune to switching noise (e.g., VSW ringing), blanking, and slew rate errors. Certain aspects may also reduce die size and lower costs (e.g., by removing the FPFET and/or the BATFET). These techniques may be used for any SMPS, including an SMPS implemented in a battery charger.

Certain aspects of the present disclosure provide a current-sensing circuit (e.g., current-sensing circuit 400, 700, or 720) for an SMPS (e.g., a buck converter) composed of a high-side transistor (e.g., HSFET 204) and a low-side transistor (e.g., LSFET 206) coupled to the high-side transistor. The current-sensing circuit generally includes a high-side current-sensing amplifier (e.g., HS Isense 402) having an input for coupling to the high-side transistor; a low-side current-sensing amplifier (e.g., LS Isense 404) having an input for coupling to the low-side transistor; a first sample-and-hold circuit (e.g., sample-and-hold circuit 408, labeled "S/H I0") coupled to an output of the low-side current-sensing amplifier and configured to capture (e.g., hold after sampling) a current associated with the low-side transistor at a first time (e.g., $t_{f0}$) corresponding to the low-side transistor turning off; a second sample-and-hold circuit (e.g., sample-and-hold circuit 410, labeled "S/H I1") coupled to an output of the high-side current-sensing amplifier and configured to capture a current associated with the high-side transistor at a second time (e.g., $t_{f1}$) corresponding to a first delay (e.g., t1) after the high-side transistor turns on; a third sample-and-hold circuit (e.g., sample-and-hold circuit 412, labeled "S/H I2") coupled to the output of the high-side current-sensing amplifier and configured to capture the current associated with the high-side transistor at a third time (e.g., $t_{f2}$) corresponding to the high-side transistor turning off; a first voltage-to-current converter (e.g., transconductance amplifier 702) having an input coupled to an output of the first sample-and-hold circuit and to an output of the second sample-and-hold circuit; a first switch (e.g., switch S1) coupled between an output of the high-side current-sensing amplifier and a sensing node (e.g., sensing node 422) for the current-sensing circuit; and a second switch (e.g., switch S3) coupled between an output of the first voltage-to-current converter and the sensing node.

According to certain aspects, the current-sensing circuit further includes a fourth sample-and-hold circuit (e.g., sample-and-hold circuit 414, labeled "S/H I3") coupled to the output of the low-side current-sensing amplifier and configured to capture the current associated with the low-side transistor at a fourth time (e.g., $t_{f3}$) corresponding to a second delay (e.g., t2) after the low-side transistor turns on; a second voltage-to-current converter (e.g., transconductance amplifier 704) having an input coupled to an output of the third sample-and-hold circuit and to an output of the fourth sample-and-hold circuit; and a third switch (e.g., switch S2) coupled between an output of the second voltage-to-current converter and the sensing node. For certain aspects, the current-sensing circuit further includes a fourth switch (e.g., switch S8) having a first terminal coupled to the output of the second sample-and-hold circuit and having a second terminal coupled to the output of the first sample-and-hold circuit and to the input of the first voltage-to-current converter; and a fifth switch (e.g., switch S9) having a first terminal coupled to the output of the third sample-and-hold circuit and having a second terminal coupled to the output of the fourth sample-and-hold circuit and to the input of the second voltage-to-current converter.

According to certain aspects, the current-sensing circuit further includes a third voltage-to-current converter (e.g., transconductance amplifier 706) having an input coupled to the output of the first sample-and-hold circuit and to the output of the second sample-and-hold circuit; a fourth switch (e.g., switch S10) coupled between an output of the third voltage-to-current converter and an input-current-sensing node; and a fifth switch (e.g., switch S12) coupled between the output of the high-side current-sensing amplifier and the input-current-sensing node. For certain aspects, the current-sensing circuit further includes a sixth switch (e.g., switch S11) coupled between the input-current-sensing node and a reference potential node (e.g., electrical ground).

According to certain aspects, the current-sensing circuit further includes a shunt resistor (e.g., resistive element 406) coupled between an output of the high-side current-sensing amplifier and a reference potential node. In this case, the output of the high-side current-sensing amplifier may be coupled to the output of the low-side current-sensing amplifier. For certain aspects, the shunt resistor has a resistance, and the first voltage-to-current converter is configured to have a transconductance ($g_m$) inversely proportional to the resistance of the shunt resistor.

According to certain aspects, the current-sensing circuit further includes a first shunt resistor (e.g., resistor R1,A) coupled between an output of the high-side current-sensing amplifier and a reference potential node; a second shunt resistor (e.g., resistor R1,B) coupled between an output of the low-side current-sensing amplifier and the reference potential node; and a third switch (e.g., switch S13) coupled between the output of the low-side current-sensing amplifier and the sensing node.

According to certain aspects, the current-sensing circuit further includes at least one of a low-pass filter or an error amplifier (e.g., the low-pass filter or error amplifier 420) having an input coupled to the sensing node.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

The various aspects illustrated and described herein are provided merely as examples to illustrate various features of the claims. However, features shown and described with respect to any given aspect are not necessarily limited to the associated aspect and may be used or combined with other aspects that are shown and described. Further, the claims are not intended to be limited by any one example aspect.

The foregoing method descriptions and the process flow diagrams are provided merely as illustrative examples and are not intended to require or imply that the steps or actions of various aspects must be performed in the order presented. As will be appreciated by one having ordinary skill in the art, the method steps and/or actions may be interchanged with one another without departing from the scope of the claims. Words such as "thereafter," "then," "next," etc. in the description are not intended to limit the order of the steps or actions; these words are simply used to guide the reader through the description of the methods. In other words, unless a specific order of steps or actions is specified, the order and/or use of specific steps and/or actions may be modified without departing from the scope of the claims. Further, any reference to claim elements in the singular, for example, using the articles "a," "an," or "the" is not to be construed as limiting the element to the singular.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, the term "coupled" may encompass both direct and indirect coupling. Thus, first and second parts are said to be coupled together when directly contacting one another, as well as when the first part couples to an intermediate part, which couples either directly or via one or more additional intermediate parts to the second part.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal, supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The preceding description of the various aspects of the present disclosure is provided to enable any person skilled in the art to implement the disclosed aspects. Various modifications to these aspects will be readily apparent to those skilled in the art, and the generic principles defined herein may be applied to some aspects without departing from the spirit or scope of the disclosure. Thus, the present disclosure is not intended to be limited to the aspects shown herein, but is to be accorded the widest scope consistent with the following claims and the principles and novel features disclosed herein.

What is claimed is:

1. A method of current sensing and correction for a switched-mode power supply comprising a high-side transistor and a low-side transistor coupled to the high-side transistor, the method comprising:
   capturing, with a current-sensing circuit, a current associated with the low-side transistor at a first time corresponding to the low-side transistor turning off;
   capturing a current associated with the high-side transistor at a second time corresponding to a first delay after the high-side transistor turns on;

capturing the current associated with the high-side transistor at a third time corresponding to the high-side transistor turning off; and applying a first correction current to a current-summing node of the current-sensing circuit for a first interval based on the first delay, wherein the first correction current is based on the captured current associated with the low-side transistor at the first time and on the captured current associated with the high-side transistor at the second time.

2. The method of claim 1, wherein the first delay is based on a blanking time and a settling time for a high-side current-sensing amplifier coupled to the high-side transistor, such that the high-side current-sensing amplifier corresponds to an inductor current for the switched-mode power supply by the second time.

3. The method of claim 1, further comprising averaging the captured current associated with the low-side transistor at the first time and the captured current associated with the high-side transistor at the second time to obtain an averaged current, wherein the first correction current is the averaged current.

4. The method of claim 1, wherein the first interval equals the first delay.

5. The method of claim 1, further comprising determining an average input current for the switched-mode power supply based on the first correction current, the captured current associated with the high-side transistor at the second time, the captured current associated with the high-side transistor at the third time, and a duty cycle of the switched-mode power supply.

6. The method of claim 1, further comprising:
capturing the current associated with the low-side transistor at a fourth time corresponding to a second delay after the low-side transistor turns on; and applying a second correction current to the current-summing node for a second interval based on the second delay, wherein the second correction current is based on the captured current associated with the high-side transistor at the third time and on the captured current associated with the low-side transistor at the fourth time.

7. The method of claim 6, wherein the second delay is based on a blanking time and a settling time for a low-side current-sensing amplifier coupled to the low-side transistor, such that the low-side current-sensing amplifier corresponds to an inductor current for the switched-mode power supply by the fourth time.

8. The method of claim 6, further comprising averaging the captured current associated with the high-side transistor at the third time and the captured current associated with the low-side transistor at the fourth time to obtain an averaged current, wherein the second correction current is the averaged current.

9. The method of claim 6, wherein the second interval equals the second delay.

10. The method of claim 6, wherein:
the first time, the second time, the third time, and the fourth time occur during a first switching period of the switched-mode power supply;
the first interval occurs during a second switching period of the switched-mode power supply while the high-side transistor is turned on;
the second switching period is subsequent to the first switching period; and
the second interval occurs during the second switching period of the switched-mode power supply while the low-side transistor is turned on.

11. The method of claim 6, further comprising:
capturing the current associated with the low-side transistor at a fifth time corresponding to the low-side transistor turning off, wherein a time difference between the fifth time and the first time is one switching period for the switched-mode power supply; and determining an average output current for the switched-mode power supply based on the first correction current, the captured current associated with the high-side transistor at the second time, the captured current associated with the high-side transistor at the third time, the second correction current, the captured current associated with the low-side transistor at the fourth time, and the captured current associated with the low-side transistor at the fifth time.

12. A current-sensing circuit for a switched-mode power supply comprising a high-side transistor and a low-side transistor coupled to the high-side transistor, the current-sensing circuit comprising:
a high-side current-sensing amplifier having an input for coupling to the high-side transistor;
a low-side current-sensing amplifier having an input for coupling to the low-side transistor;
a first sample-and-hold circuit coupled to an output of the low-side current-sensing amplifier and configured to capture a current associated with the low-side transistor at a first time corresponding to the low-side transistor turning off;
a second sample-and-hold circuit coupled to an output of the high-side current-sensing amplifier and configured to capture a current associated with the high-side transistor at a second time corresponding to a first delay after the high-side transistor turns on;
a third sample-and-hold circuit coupled to the output of the high-side current-sensing amplifier and configured to capture the current associated with the high-side transistor at a third time corresponding to the high-side transistor turning off;
a first voltage-to-current converter having an input coupled to an output of the first sample-and-hold circuit and to an output of the second sample-and-hold circuit;
a first switch coupled between an output of the high-side current-sensing amplifier and a sensing node for the current-sensing circuit; and
a second switch coupled between an output of the first voltage-to-current converter and the sensing node.

13. The current-sensing circuit of claim 12, further comprising:
a fourth sample-and-hold circuit coupled to the output of the low-side current-sensing amplifier and configured to capture the current associated with the low-side transistor at a fourth time corresponding to a second delay after the low-side transistor turns on;
a second voltage-to-current converter having an input coupled to an output of the third sample-and-hold circuit and to an output of the fourth sample-and-hold circuit; and
a third switch coupled between an output of the second voltage-to-current converter and the sensing node.

14. The current-sensing circuit of claim 13, further comprising:
a fourth switch having a first terminal coupled to the output of the second sample-and-hold circuit and having a second terminal coupled to the output of the first sample-and-hold circuit and to the input of the first voltage-to-current converter; and a fifth switch having a first terminal coupled to the output of the third sample-and-hold circuit and having a second terminal coupled to the output of the fourth sample-and-hold circuit and to the input of the second voltage-to-current converter.

15. The current-sensing circuit of claim 13, further comprising
a third voltage-to-current converter having an input coupled to the output of the first sample-and-hold circuit and to the output of the second sample-and-hold circuit;
a fourth switch coupled between an output of the third voltage-to-current converter and an input-current-sensing node; and
a fifth switch coupled between the output of the high-side current-sensing amplifier and the input-current-sensing node.

16. The current-sensing circuit of claim 15, further comprising a sixth switch coupled between the input-current-sensing node and a reference potential node.

17. The current-sensing circuit of claim 12, further comprising a shunt resistor coupled between an output of the high-side current-sensing amplifier and a reference potential node, wherein the output of the high-side current-sensing amplifier is coupled to the output of the low-side current-sensing amplifier.

18. The current-sensing circuit of claim 17, wherein the shunt resistor has a resistance and wherein the first voltage-to-current converter is configured to have a transconductance inversely proportional to the resistance of the shunt resistor.

19. The current-sensing circuit of claim 12, further comprising:
a first shunt resistor coupled between an output of the high-side current-sensing amplifier and a reference potential node;
a second shunt resistor coupled between an output of the low-side current-sensing amplifier and the reference potential node; and
a third switch coupled between the output of the low-side current-sensing amplifier and the sensing node.

20. The current-sensing circuit of claim 12, further comprising at least one of a low-pass filter or an error amplifier having an input coupled to the sensing node.

* * * * *